United States Patent [19]
Kasahara et al.

[11] Patent Number: 5,701,107
[45] Date of Patent: Dec. 23, 1997

[54] PHASE SHIFTER CIRCUIT USING FIELD EFFECT TRANSISTORS

[75] Inventors: Michiaki Kasahara; Hazime Kawano; Kazuyoshi Inami; Kohichi Muroi; Yoshitada Iyama, all of Kamakura, Japan

[73] Assignee: Mitsubishi Denki Kabushiki Kaisha, Tokyo, Japan

[21] Appl. No.: 614,765

[22] Filed: Mar. 13, 1996

[30] Foreign Application Priority Data

Mar. 15, 1995 [JP] Japan .................. HEI 7-055854

[51] Int. Cl.$^6$ .................................. H01P 3/00
[52] U.S. Cl. ............................ 333/164; 333/139
[58] Field of Search .................. 333/164, 138, 333/139, 156

[56] References Cited

U.S. PATENT DOCUMENTS

| | | | |
|---|---|---|---|
| H954 | 8/1991 | Lang et al. | 333/164 |
| 4,733,203 | 3/1988 | Ayasli | 333/164 |
| 5,045,731 | 9/1991 | Riddle | 333/164 |
| 5,148,062 | 9/1992 | Goldfarb | 333/164 |
| 5,180,998 | 1/1993 | Willems | 333/164 |
| 5,317,290 | 5/1994 | Jacomb-Hood | 333/164 |
| 5,379,007 | 1/1995 | Nakahara | 333/164 |
| 5,392,010 | 2/1995 | Nakahara | 333/164 |
| 5,424,696 | 6/1995 | Nakahara et al. | 333/164 |
| 5,519,349 | 5/1996 | Nakahara | 333/164 |

OTHER PUBLICATIONS

Aust, Wang, Carandang, Tan, Chen, Trinh, Esfandian & Yen "GaAs Monolithic Components Development for Q-Band Phased Array Application" 1992 IEEE MTT-S Digest, pp. 703-706.

Dunn, Hodges, Sy & Alyassini "MMIC Phase Shifters and Amplifiers for Millimeter-Wavelength Active Arrays" 1989 IEEE MTT S Digest, pp. 127-130.

Primary Examiner—Robert Pascal
Assistant Examiner—Darius Gambino
Attorney, Agent, or Firm—Wolf, Greenfield & Sacks, P.C.

[57] ABSTRACT

A phase shifter, which can switch between a phase delay circuit and a phase leading circuit consisting of inductors and capacitors, is constituted by disposing FETs having inductors or capacitors arranged in parallel with the source and drain electrodes of each FET connected and controlling a bias voltage to be applied to the gate electrodes of the FETs to switch between the on and off conditions of the FETs. Thus, a phase shifter obtained has a small frequency characteristic.

29 Claims, 20 Drawing Sheets

1: FIRST FET
2: CAPACITOR
3: SECOND FET
4: INDUCTOR
5: THIRD FET
6: FOURTH FET
7: FIFTH FET
8: SIXTH FET
9: GROUND

1: FIRST FET
2: CAPACITOR
3: SECOND FET
4: INDUCTOR
5: THIRD FET
6: FOURTH FET
7: FIFTH FET
8: SIXTH FET
9: GROUND

PHASE SHIFTER CIRCUIT USING FIELD EFFECT TRANSISTORS

BACKGROUND OF THE INVENTION

1. Field of the Invention

The invention relates to a phase shifter using, as a switching device, an FET (field-effect transistor) which operates at microwave and millimetric wave bands.

2. Description of the Related Art

The FET-using phase shifter is commonly used for various transmission circuits and phased array antennas at microwave and millimetric wave bands. The conventional phase shifters include one having an equivalent circuit as shown in FIG. 35, which is known as a switched line type phase shifter.

In FIG. 35, reference numeral 1 is a first FET, 3 a second FET, 5 a third FET, 6 a fourth FET, 25 a reference transmission line, and 26 a delay transmission line. A drain electrode 27a of the first FET 1 and a drain electrode 27 b of the second FET 3 are connected to an input terminal 10, and a drain electrode 27 c of the third FET 5 and a drain electrode 27 d of the fourth FET 6 are connected to an output terminal 11. The reference transmission line 25 is connected between a source electrode 28b of the second FET 3 and a source electrode 28d of the fourth FET 6, and the delay transmission line 26 having an electrical length longer than the reference transmission line 25 is connected between a source electrode 28a of the first FET 1 and a source electrode 28c of the fourth FET 6. Reference numeral 29 is a gate electrode for each FET.

Operation of the above conventional phase shifter will be described with reference to FIG. 35. When a bias voltage 0[V] is applied to the FET gate, the FET is turned on, and impedance between the drain electrode and the source electrode is low in resistance. Conversely, when a bias voltage corresponding to a pinch-off voltage is applied to the FET gate, the FET is turned off, and the impedance between the drain electrode and the source electrode is high in capacitance. This characteristic is utilized to use the FET as a switch for a high-frequency signal. A resistance value with the FET on and a capacitance value with the FET off depend on a total gate electrode length of the FET, and can be determined to be desired values according to a frequency used.

When a pinch-off voltage is applied to a gate electrode 29a of the first FET 1 and to a gate electrode 29c of the third FET 5 and 0[V] is applied to a gate electrode 29b of the second FET 3 and to a gate electrode 29d of the fourth FET 6, there is a high capacitive impedance (off condition) between the drain electrode 27 a and the source electrode 28a of the first FET 1 and between the drain electrode 27 c and the source electrode 28c of the third FET 5. On the other hand, there is a low resistive impedance (on condition) between the drain electrode 27 b and the source electrode 28b of the second FET 3 and between the drain electrode 27 b and the source electrode 28d of the fourth FET 6. Under these conditions, a high-frequency signal entered from the input terminal 10 is outputted from the output terminal 11 through the second FET 3 which is on, the reference transmission line 25 and the fourth FET 6 which is on.

Then, when 0[V] is applied to the gate electrode 29a of the first FET 1 and to the gate electrode 29c of the third FET 5 and a pinch-off voltage is applied to the gate electrode 29b of the second FET 3 and to the gate electrode 29d of the fourth FET 6, a high-frequency signal entered from the input terminal 10 is outputted from the output terminal 11 through the first FET 1 which is on, the delay transmission line 26 and the third FET 5 which is on. At that time, the phase shift quantity of the high-frequency signal passed from the input terminal 10 to the output terminal 11 is delayed by a difference of phases passed through the reference transmission line 25 and the delay transmission line 26 with respect to the phase shift quantity passed just through the reference transmission line 25.

Thus, when the on and off conditions of the first through fourth FETs are controlled according to a voltage applied to the gate electrode 29, the routes of the high-frequency signal can operate as a switching phase shifter.

The above configured conventional phase shifter requires a large passing phase difference between the reference transmission line and the delay transmission line, i.e., a large difference in line pattern length, to have a high phase shift quantity. Accordingly, it has disadvantages that the circuit is required to be large and frequency characteristics of the determined phase become large when the line length is extended.

The conventional switched line type phase shifter uses a difference in length between the reference transmission line and the delay transmission line to carry out phase shifting.

The relationship between a line length, a phase-shift quantity and a frequency will be described. A different frequency has a different wavelength. For instance, a signal wave having a frequency of $1 \times 10^9$ Hz has a wavelength of 3 cm, and a signal wave having a frequency of $1 \times 10^{10}$ Hz has a wavelength of 0.3 cm. When a line is used to perform phase-shifting of a signal wave having a frequency of $1 \times 10^9$ Hz by 360° (corresponding to one wavelength of the signal wave), the line is required to be 3 cm long. Conversely, when a line is 3 cm long, it works as a 360° phase-shifting circuit for a signal wave having a frequency of $1 \times 10^9$ Hz, as a 396° phase-shifting circuit for a signal wave having a frequency of $1.1 \times 10^9$ Hz, and as a 324° phase-shifting circuit for a signal wave having a frequency of $0.9 \times 10^9$ Hz. Further, when a line is 1 cm long, it works as a 120° phase-shifting circuit for a signal wave having a frequency of $1 \times 10^9$ Hz, as a 132° phase-shifting circuit for a signal wave having a frequency of $1.1 \times 10^9$ Hz, and as a phase-shifting circuit of about 108° for a signal wave having a frequency of $0.9 \times 10^9$ Hz. Thus, when the line length is the same, the phase-shift quantity is variable depending on frequency.

When the phase shifter is used, phase-shift quantity is generally desired to be constant with respect to any signal wave having any frequency at the frequency zone (from the lowest frequency to the highest frequency of the frequency used) of the signal wave being phase-shifted. For example, since a phased array antenna changes its direction according to a phase-shift quantity determined for a signal wave, phase-shift quantity not based on a frequency is required to keep the direction constant without depending on the frequency of a signal (generally, a plurality of frequencies are used). As another example, a phase modulation method, which is one transmission code form for communication, needs to keep a determined phase constant without relying on the frequency of a carrier wave for coding in order to carry out proper coding.

Assuming that a switched line type phase shifter has a frequency range of $0.9 \times 10^9$ Hz to $1.1 \times 10^9$ Hz and a phase-shifting line length of 3 cm, its phase-shift quantity is 360° at a center frequency ($1 \times 10^9$ Hz) in the frequency band, but as described above it is 396° for a signal wave having a frequency of $1.1 \times 10^9$ Hz and 324° for a signal wave having a frequency of $0.9 \times 10^9$ Hz. The phase-shift quantity per signal frequency in the used frequency band is designated as "frequency characteristic of set phase". The "frequency characteristic of set phase" has a difference in phase-shift quantity of 72° between a signal wave having a frequency of $1.1 \times 10^9$ Hz and a signal wave having a frequency of $0.9 \times 10^9$ Hz when a phase-shifting line length is 3 cm and a difference in phase-shift quantity of 24° between a signal wave having a frequency of $1.1 \times 10^9$ Hz and a signal wave having a frequency of $0.9 \times 10^9$ Hz when a phase-shifting line length is 1 cm. Thus, the larger the set phase (the longer the line length), the higher the "frequency characteristic of set phase" becomes. This is disadvantageous for users who require a constant phase-shift quantity.

SUMMARY OF THE INVENTION

The invention has been completed to remedy the above disadvantages and aims to provide a phase shifter which is compact and has a small frequency characteristic.

In a phase shifter according to Embodiment 1 of the invention, two circuits are connected in series between an input terminal and an output terminal. Each circuit consists of a first FET connected in parallel with a capacitor and a second FET connected in parallel with an inductor, these FETs being connected in series with each other. Another circuit is connected in parallel with a line which connects the input terminal and the output terminal, this circuit consisting of a fifth FET connected in parallel with a capacitor and a sixth FET connected in parallel with an inductor, these FETs being connected in series. A prescribed bias voltage is applied to gate electrodes of the above FETs.

In a phase shifter according to Embodiment 2 of the invention, two circuits are connected in series between an input terminal and an output terminal. Each circuit consists of a first FET, and a second FET connected in parallel with an inductor, these FETs being connected in series. Another circuit is connected in parallel with a line which connects the input terminal and the output terminal, this circuit consists of a fifth FET connected in parallel with a capacitor and a sixth FET connected in parallel with an inductor, these FETs are connected in series, and a prescribed bias voltage is applied to gate electrodes of the above FETs.

In a phase shifter according to Embodiment 3 of the invention, two circuits are connected in series between an input terminal and an output terminal. Each circuit consists of a first FET connected in parallel with a capacitor and a second FET connected in parallel with an inductor, these FETs being connected in series. Another circuit is connected in parallel with a line which connects the input terminal and the output terminal. This circuit consists of a fifth FET, and a sixth FET connected in parallel with an inductor, these FETs being connected in series, and a prescribed bias voltage is applied to gate electrodes of the above FETs.

In a phase shifter according to Embodiment 4 of the invention, two circuits are connected in series between an input terminal and an output terminal. Each circuit consists of a first FET, and a second FET connected in parallel with an inductor, these FETs being connected in series. Another circuit is connected in parallel to a line which connects the input terminal and the output terminal. This circuit consists of a fifth FET, and a sixth FET connected in parallel with an inductor, these FETs being connected in series, and a prescribed bias voltage is applied to gate electrodes of the above FETs.

In a phase shifter according to Embodiment 5 of the invention, a circuit comprising a first FET connected in parallel with an inductor is replicated, and the two identical circuits are disposed in series between an input terminal and an output terminal. A circuit is connected in parallel to a line which connects the input terminal and the output terminal. This circuit consists of a fifth FET, and a sixth FET connected in parallel to an inductor, these FETs being connected in series. A prescribed bias voltage is applied to gate electrodes of the above FETs.

In a phase shifter according to Embodiment 6 of the invention, two FETs, each connected in parallel with a capacitor, are connected in series between an input terminal and an output terminal. A circuit is connected in parallel to a line which connects the input terminal and the output terminal. This circuit consists of a fifth FET, and a sixth FET connected in parallel with an inductor, these FETs being connected in series. A prescribed bias voltage is applied to gate electrodes of the above FETs.

In a phase shifter according to Embodiment 7 of the invention, a first FET and a second FET are connected in series between an input terminal and an output terminal, and a circuit is connected in parallel to a line which connects the input terminal and the output terminal. This circuit consists of a third FET, and a fourth FET connected in parallel with an inductor, these FETs being connected in series, and a prescribed bias voltage is applied to gate electrodes of the above FETs.

In a phase shifter according to Embodiment 8 of the invention, two circuits are connected in parallel to a line connecting an input terminal and an output terminal. Each circuit consists of a first FET connected in parallel with a capacitor and a second FET connected in parallel with an inductor, these FETs being connected in series. Another circuit is connected in series between the input terminal and the output terminal. This circuit consists of a fifth FET connected in parallel with a capacitor and a sixth FET connected in parallel with an inductor, these FETs being connected in series, and a prescribed bias voltage is applied to gate electrodes of the above FETs.

In a phase shifter according to Embodiment 9 of the invention, two circuits are connected in parallel to a line connecting an input terminal and an output terminal. Each circuit consists of a first FET, and a second FET connected in parallel with an inductor, these FETs being connected in series. Another circuit is connected in series between the input terminal and the output terminal. This circuit consists of a fifth FET connected in parallel with a capacitor and a sixth FET connected in parallel with an inductor, these FETs being connected in series, and a prescribed bias voltage is applied to gate electrodes of the above FETs.

In a phase shifter according to Embodiment 10 of the invention, two circuits are connected in parallel between an input terminal and an output terminal, each circuit consisting of a first FET connected in parallel with a capacitor and a second FET connected in parallel with an inductor, these FETs being connected in series. Another circuit is connected in series with a line which connects the input terminal and the output terminal. This circuit consists of a fifth FET, and a sixth FET connected in parallel with an inductor, these FETs being connected in series. A prescribed bias voltage is applied to gate electrodes of the above FETs.

In a phase shifter according to Embodiment 11 of the invention, two circuits are connected in parallel with a line connecting an input terminal and an output terminal, each circuit consisting of a first FET, and a second FET connected in parallel with an inductor, these FETs being connected in series. Another circuit is connected in series between the input terminal and the output terminal, this circuit consisting of a fifth FET, and a sixth FET connected in parallel with an inductor, these FETs being connected in series. A prescribed bias voltage is applied to gate electrodes of the above FETs.

In a phase shifter according to Embodiment 12 of the invention, two circuits are connected in parallel with a line connecting an input terminal and an output terminal. Each circuit consists of a first FET, and a second FET connected in parallel with an inductor, these FETs being connected in series. A fifth FET connected in parallel with a capacitor is connected in series between the input terminal and the output terminal, and a prescribed bias voltage is applied to gate electrodes of the above FETs.

In a phase shifter according to Embodiment 13 of the invention, two circuits are connected in parallel with a line connecting an input terminal and an output terminal, each circuit consisting of a first FET, and a second FET connected in parallel with an inductor, these FETs being connected in series. A fifth FET is connected in series between the input terminal and the output terminal, and a prescribed bias voltage is applied to gate electrodes of the above FETs.

In a phase shifter according to Embodiment 14 of the invention, two circuits are connected in parallel with a line connecting an input terminal and an output terminal, each circuit consisting of a first FET, and a second FET connected in parallel with an inductor, these FETs being connected in series. A fifth FET connected in parallel with an inductor is connected in series between the input terminal and the output terminal, and a prescribed bias voltage is applied to gate electrodes of the above FETs.

In a phase shifter according to Embodiment 15 of the invention, a first FET connected in parallel with a capacitor and a second FET connected in parallel with an inductor are connected in series between an input terminal and an output terminal. A circuit is connected in parallel with a line which connects the input terminal and the output terminal, this circuit consisting of a third FET, and a fourth FET connected in parallel with an inductor, these FETs being connected in series. A prescribed bias voltage is applied to gate electrodes of the above FETs.

In a phase shifter according to Embodiment 16 of the invention, a second FET, and a first FET connected in parallel with an inductor, are connected in series between an input terminal and an output terminal. A circuit is connected in parallel with a line which connects the input terminal and the output terminal, this circuit consisting of a third FET, and a fourth FET connected in parallel with an inductor, these FETs being connected in series. A prescribed bias voltage is applied to gate electrodes of the above FETs.

In a phase shifter according to Embodiment 17 of the invention, a first FET connected in parallel with an inductor is connected in series between an input terminal and an output terminal. A circuit is connected in parallel with a line which connects the input terminal and the output terminal, this circuit consisting of a second FET, and a third FET connected in parallel with an inductor, these FETs being connected in series. A prescribed bias voltage is applied to gate electrodes of the above FETs.

In a phase shifter according to Embodiment 18 of the invention, a first FET connected in parallel with a capacitor is connected in series between an input terminal and an output terminal. A circuit is connected in parallel with a line which connects the input terminal and the output terminal, this circuit consisting of a second FET, and a third FET connected in parallel with an inductor, these FETs being connected in series. A prescribed bias voltage is applied to gate electrodes of the above FETs.

In a phase shifter according to Embodiment 19 of the invention, a first FET is connected in series between an input terminal and an output terminal. A circuit is connected in parallel with a line which connects the input terminal and the output terminal, this circuit consisting of a second FET, and a third FET connected in parallel with an inductor, these FETs being connected in series. A prescribed bias voltage is applied to gate electrodes of the above FETs.

In a phase shifter according to Embodiment 20 of the invention, both ends of an inductor line pattern connected in parallel with an FET are connected to source electrode patterns and drain electrode patterns which are in a interdigital(comb teeth) form of the FET. Where interdigital (comb teeth) means "formed in an interlaced pattern".

In a phase shifter according to Embodiment 21 of the invention, line patterns forming the input and output terminals of a capacitor connected in parallel with an FET are connected to source electrode patterns and drain electrode patterns which are in a interdigital(comb teeth) form of the FET.

In a phase shifter according to Embodiment 22 of the invention, gate electrode patterns are formed in gaps between source electrode patterns and drain electrode patterns which are in a interdigital(comb teeth) form to form an FET, and remaining source electrode patterns and drain electrode patterns are connected to form an inductor.

In a phase shifter according to Embodiment 23 of the invention, gate electrode patterns are formed in gaps between source electrode patterns and drain electrode patterns which are in a interdigital(comb teeth) form to form an FET, and a Metal insulator Metal capacitor (hereinafter referred to as "MIM capacitor") is formed between remaining source electrode patterns and drain electrode patterns.

In a phase shifter according to Embodiment 24 of the invention, gate electrode patterns are formed in gaps between source electrode patterns and drain electrode patterns which are in a interdigital(comb teeth) form to form an FET, and an interdigital capacitor is formed between remaining source electrode patterns and drain electrode patterns.

In a phase shifter according to Embodiment 25 of the invention, grounding is made through a source electrode or drain electrode capacitor of an FET.

In Embodiment 1 of the invention, a prescribed bias voltage is applied to gate electrodes of FETs which are connected in parallel with an inductor or capacitor to select a combination of on and off conditions of the FETs, thereby switching between a T-type phase delay circuit consisting of the inductor and the capacitor and a T-type phase leading circuit.

In Embodiment 2 of the invention, a capacitive component produced between a drain electrode and a source electrode with FETs off and a capacitor and inductors connected in parallel to the FETs are used to select a combination of on and off conditions of the FETs, thereby switching between a T-type phase delay circuit consisting of the inductor and the capacitor and a T-type phase leading circuit.

In Embodiment 3 of the invention, a capacitive component produced between a drain electrode and a source electrode with FETs off and a capacitor and inductors connected in parallel with the FETs are used to select a combination of on and off conditions of the FETs, thereby switching between a T-type phase delay circuit consisting of the inductor and the capacitor and a T-type phase leading circuit.

In Embodiment 4 of the invention, a capacitive component produced between a drain electrode and a source electrode with FETs off and inductors connected in parallel with the FETs are used to select a combination of on and off conditions of the FETs, thereby switching between a T-type phase delay circuit consisting of the inductor and the capacitor and a T-type phase leading circuit.

In Embodiment 5 of the invention, a capacitive component produced between a drain electrode and a source electrode with FETs off and inductors connected in parallel to the FETs are used to select a combination of on and off conditions of the FETs, thereby switching between a passing circuit and a T-type phase delay circuit consisting of the inductor and the capacitor.

In Embodiment 6 of the invention, a capacitive component produced between a drain electrode and a source electrode with FETs off and capacitors and an inductor connected in parallel with the FETs are used to select a combination of on and off conditions of the FETs, thereby switching between a passing circuit and a T-type phase leading circuit consisting of the inductor and the capacitors.

In Embodiment 7 of the invention, a capacitive component produced between a drain electrode and a source electrode with FETs off and an inductor connected in parallel with an FET are used to select a combination of on and off conditions of the FETs, thereby switching between a passing circuit and a T-type phase leading circuit consisting of the inductor and the capacitors.

In Embodiment 8 of the invention, a prescribed bias voltage is applied to gate electrodes of FETs which are connected in parallel with an inductor or capacitor to select a combination of on and off conditions of the FETs, thereby switching between a π-type phase delay circuit consisting of the inductor and the capacitor and a π-type phase leading circuit.

In Embodiment 9 of the invention, a capacitive component produced between a drain electrode and a source electrode with FETs off and a capacitor and inductors connected in parallel with the FETs are used to select a combination of on and off conditions of the FETs, thereby switching between a π-type phase delay circuit consisting of the inductors and the capacitor and a π-type phase leading circuit.

In Embodiment 10 of the invention, a capacitive component produced between a drain electrode and a source electrode with FETs off and capacitors and inductors connected in parallel with the FETs are used to select a combination of on and off conditions of the FETs, thereby switching between a π-type phase delay circuit consisting of the inductors and the capacitors and a π-type phase leading circuit.

In Embodiment 11 of the invention, a capacitive component produced between a drain electrode and a source electrode with FETs off and inductors connected in parallel with the FETs are used to select a combination of on and off conditions of the FETs, thereby switching between a π-type phase delay circuit consisting of the inductors and the capacitors and a π-type phase leading circuit.

In Embodiment 12 of the invention, a capacitive component produced between a drain electrode and a source electrode with FETs off and a capacitor and inductors connected in parallel with the FETs are used to select a combination of on and off conditions of the FETs, thereby switching between a passing circuit and a π-type phase leading circuit consisting of the inductors and the capacitor.

In Embodiment 13 of the invention, a capacitive component produced between a drain electrode and a source electrode with FETs off and inductors connected in parallel with the FETs are used to select a combination of on and off conditions of the FETs, thereby switching between a passing circuit and a π-type phase leading circuit consisting of the inductors and the capacitor.

In Embodiment 14 of the invention, a capacitive component produced between a drain electrode and a source electrode with FETs off and inductors connected in parallel with the FETs are used to select a combination of on and off conditions of the FETs, thereby switching between a passing circuit and a π-type phase delay circuit consisting of the inductors and the capacitor.

In Embodiment 15 of the invention, a capacitive component produced between a drain electrode and a source electrode with FETs off and a capacitor and inductors connected in parallel with the FETs are used to select a combination of on and off conditions of the FETs, thereby switching between an LC phase delay circuit consisting of the inductor and the capacitor and an LC phase leading circuit.

In Embodiment 16 of the invention, a capacitive component produced between a drain electrode and a source electrode with FETs off and inductors connected in parallel with the FETs are used to select a combination of on and off conditions of the FETs, thereby switching between an LC phase delay circuit consisting of the inductor and the capacitor and an LC phase leading circuit.

In Embodiment 17 of the invention, a capacitive component produced between a drain electrode and a source electrode with FETs off and inductors connected in parallel with the FETs are used to select a combination of on and off conditions of the FETs, thereby switching between a passing circuit and an LC phase delay circuit consisting of the inductor and the capacitor.

In Embodiment 18 of the invention, a capacitive component produced between a drain electrode and a source electrode with FETs off and a capacitor and an inductor connected in parallel with the FETs are used to select a combination of on and off conditions of the FETs, thereby switching between a passing circuit and an LC phase delay circuit consisting of the inductor and the capacitor.

In Embodiment 19 of the invention, a capacitive component produced between a drain electrode and a source electrode with FETs off and an inductor connected in parallel with an FET are used to select a combination of on and off conditions of the FETs, thereby switching between a passing circuit and an LC phase delay circuit consisting of the inductor and the capacitor.

In Embodiment 20 of the invention, an inductor line pattern connected in parallel with an FET is connected to source and drain electrode patterns which are formed into a interdigital(comb teeth) form to make the inductor line pattern short.

In Embodiment 21 of the invention, line patterns which form input and output terminals of a capacitor connected in parallel with an FET are connected to source and drain electrode patterns which are formed into a interdigital(comb teeth) form, so that the line patterns which form the input and output terminals of the capacitor can be arranged between source and drain electrode patterns.

In Embodiment 22 of the invention, source and drain electrode patterns of an FET are partly connected to each other to form a line pattern for forming an inductor, so that an inductor line pattern can be arranged between source and drain electrode patterns.

In Embodiment 23 of the invention, an MIM capacitor is disposed in a gap between source and drain electrode patterns of an FET, so that line patterns which form input and output terminals of a capacitor can be arranged much more tightly between the source and drain electrode patterns.

In Embodiment 24 of the invention, an interdigital capacitor is formed in a gap between source and drain electrode patterns of an FET, so that a capacitor can be realized easily and line patterns which form input and output terminals of the capacitor can be arranged much more tightly between the source and drain electrode patterns.

In Embodiment 25 of the invention, a source or drain electrode of an FET is configured without grounding in a series flow, so that the gate electrode can be controlled at a given voltage.

DESCRIPTION OF THE PREFERRED EMBODIMENTS

Embodiment 1

Figure 1:
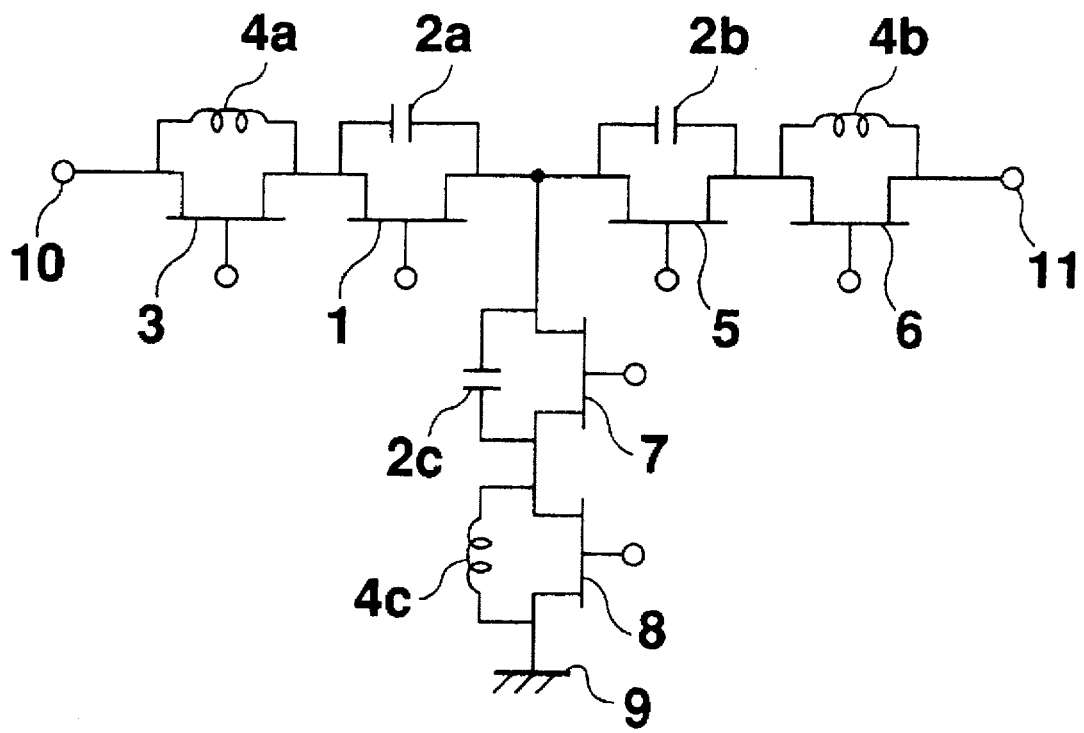
FIG. 1 is a circuit diagram showing Embodiment 1 of the invention.

Embodiment 1 of the invention will be described with reference to the accompanying drawings. FIG. 1 is a circuit diagram showing Embodiment 1 of the invention. In FIG. 1, reference numeral 1 is a first FET which is connected in parallel with capacitor 2a, 3 is a second FET which is connected in parallel with a first inductor 4a, 5 is a third FET which is connected in parallel with a second capacitor 2b, 6 is a fourth FET which is connected in parallel with a second inductor 4b, 7 is a fifth FET which is connected in parallel with a third capacitor 2c, 8 is a sixth FET which is connected in parallel with a third inductor 4c, and 9 is a ground.

Description will be given of the operation of the first embodiment with reference to FIG. 1. As described in connection with the prior art, the FETs can be turned on or off by controlling a voltage which is applied to the gate electrodes of the FETs. First, the second FET 3, the fourth FET 6 and the fifth FET 7 are turned on, and the first FET 1, the third FET 5 and the sixth FET 8 are turned off. With the FETs on, the FETs have sufficiently low impedance and a high frequency signal passes through the FETs; and with the FETs off, the FETs have high impedance and the high frequency signal passes through the circuit connected in parallel. At this time, an equivalent circuit of the phase shifter forms a T-type high-pass filter by the first capacitor 2a, the second capacitor 2b and the third inductor 4c, as shown simply in FIG. 2A, because the FETs in the on position have a sufficiently low resistance value, and serves as a phase leading circuit.

Then, the second FET 3, the fourth FET 6 and the fifth FET 7 are turned off, and the first FET 1, the third FET 5 and the sixth FET 8 are turned on. At this time, the equivalent circuit of the phase shifter forms a T-type low-pass filter by the first inductor 4a, the second inductor 4b and the third capacitor 2c, as shown simply in FIG. 2B, because the FETs in the on position have a sufficiently low resistance value, and serves as a phase delay circuit.

Thus, the on and off conditions of the FETs are controlled and the T-type phase leading circuit and the T-type phase delay circuit are switched, thereby effecting a difference in phase shift between signals passing between both circuits. Since this embodiment uses concentrated constant elements such as MIM capacitors to constitute a phase-shifting circuit, a line pattern length is not required to be extended in proportion to the phase-shift quantity as in the prior art, even when a large phase-shift quantity is required. This requirement can be dealt with by varying the constant of the concentrated constant elements which constitute the phase-shifting circuit, enabling a reduction in size. Further, a phase shifter having a small frequency characteristic can be easily designed by endowing opposite frequency characteristics on the delay phase circuit and the leading phase circuit.

Embodiment 2

Figure 3:
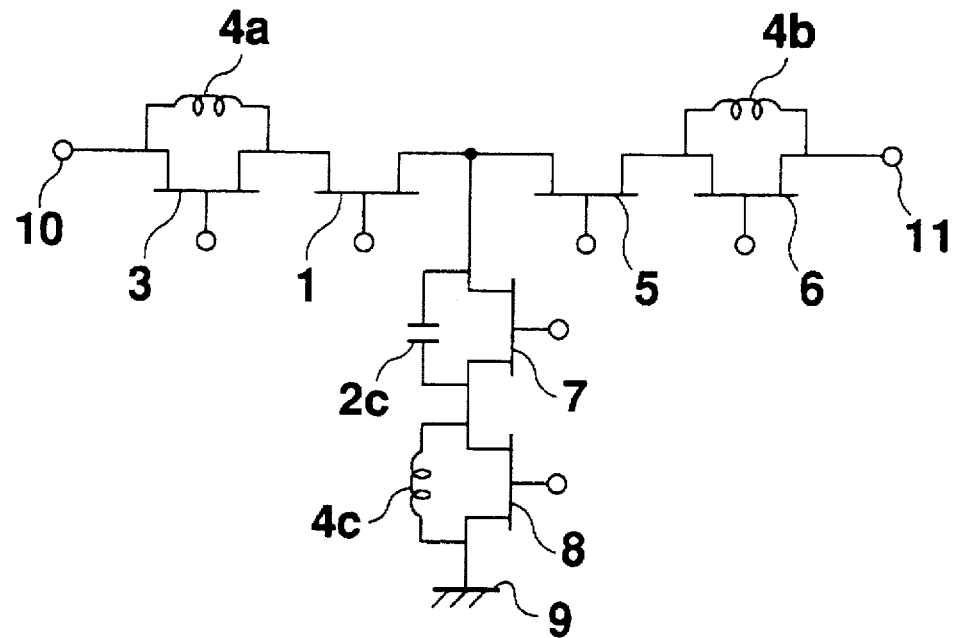
FIG. 3 is a circuit diagram showing Embodiment 2 of the invention.

FIG. 3 is a circuit diagram showing Embodiment 2 of the invention. This embodiment is different from Embodiment 1 in that the first capacitor 2a and the second capacitor 2b are omitted from FIG. 1.

Figure 2A:
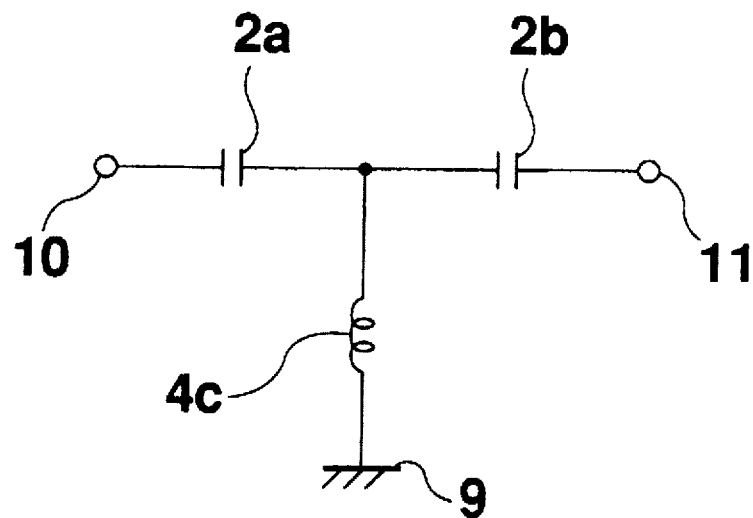
FIG. 2A and FIG. 2B are circuit diagrams illustrating the operations of Embodiment 1 of the invention.

In Embodiment 1, a capacitive component produced between the drain electrode and the source electrode when a pinch-off voltage is applied to the gate electrode of the FETs, is set to be high impedance or cut off with respect to a high frequency signal, and the capacitors connected in parallel with the FETs are used to configure the T-type phase leading circuit. Embodiment 2 uses a capacitive component with the FETs off as a capacitor forming the T-type phase leading circuit instead of the first capacitor 2a and the second capacitor 2b in Embodiment 1. On the assumption that a phase leading quantity by the T-type phase leading circuit shown in FIG. 2A is θ1 and a frequency is f, a capacitance value C1 of the first capacitor 2a and the second capacitor 2b is known to be expressed as follows:

$$C1 = \frac{1}{50 \cdot 2 \cdot \pi \cdot f \cdot \tan(\theta 1/2)} \text{ [pF]} \quad (1)$$

Generally, the capacitive component with the FETs off has a low value of several pF or below, but it can be seen from Equation (1) that since the value C1 becomes smaller as the required phase leading quantity increases or the signal frequency increases, to attain a higher phase-shifting quantity or to phase-shift a signal having a high frequency, the T-type phase leading circuit can be formed by means of a capacitive component with the FETs off. Also, the capacitive component depends on the total gate electrode length of the FETs and can be a desired capacitance value according to the setting of the total gate electrode length. The operations are the same as in Embodiment 1 except that the capacitor constituting the T-type phase leading circuit is realized by the capacitance with the first FET 1 and the third FET 5 off.

Thus, with the configuration as in Embodiment 2, the capacitors to be connected in parallel with the FETs can be eliminated and the circuit can be made compact when it is desired to have a high phase-shifting quantity and to be used at a high frequency. Further, since a parasitic inductor component is involved in an extraction line pattern for connecting the capacitors in parallel, causes of the degraded frequency characteristics in a high-frequency band can be reduced.

Embodiment 3

Figure 4:
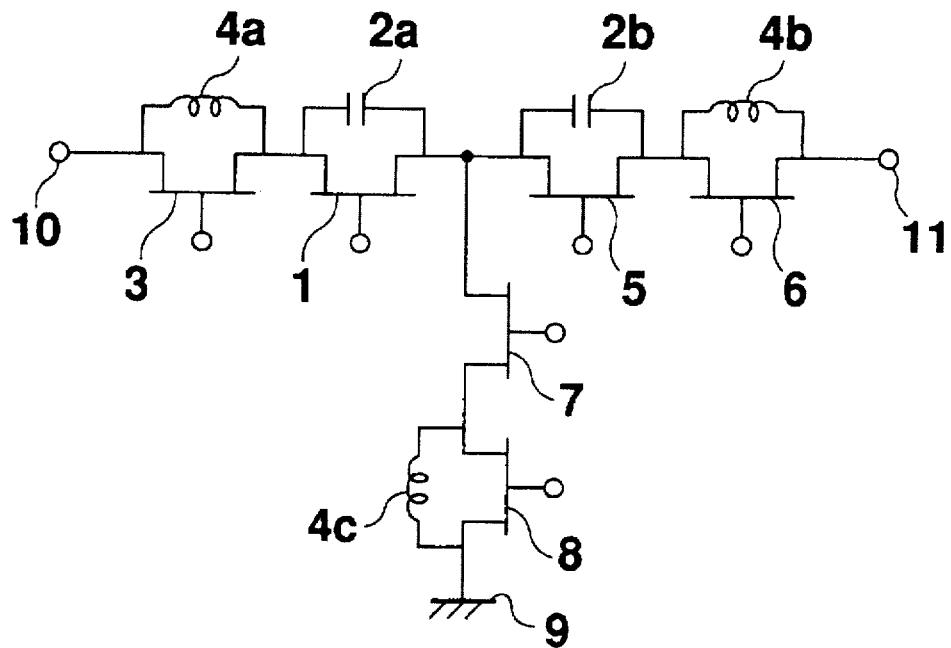
FIG. 4 is a circuit diagram showing Embodiment 3 of the invention.

FIG. 4 is a circuit diagram showing Embodiment 3 of the invention. This embodiment is different from Embodiment 1 in that the third capacitor 2c is omitted from FIG. 1.

Figure 2B:
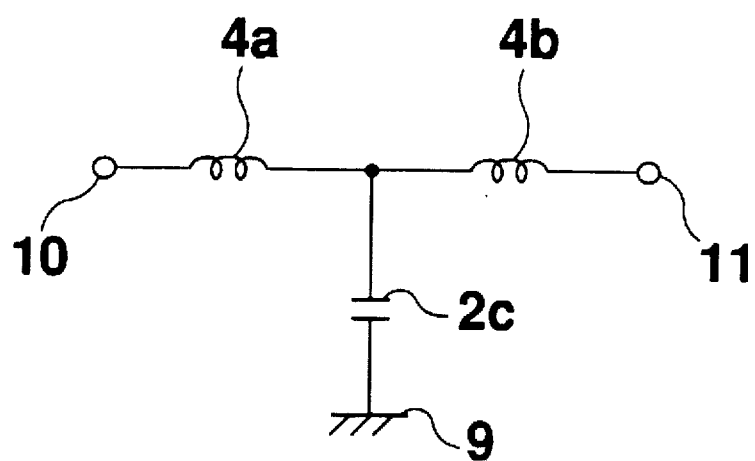

In Embodiment 1, a capacitive component produced between the drain electrode and the source electrode when a pinch-off voltage is applied to the gate electrodes of the FETs, is set to have high impedance or cut off with respect to a passing high frequency signal, and the capacitors connected in parallel with the FETs are used to constitute the T-type phase delay circuit. Embodiment 3 uses a capacitive component with the FETs off as a capacitor constituting the T-type phase delay circuit instead of the third capacitor 2c in Embodiment 1. On the assumption that a phase delay quantity by the T-type phase delay circuit shown in FIG. 2B is θ2 and a frequency is f, a capacitance value C2 of the third capacitor 2c is known to be expressed as follows:

$$C2 = \frac{\sin(\theta 2)}{50 \cdot 2 \cdot \pi \cdot f} \text{ [pF]} \quad (2)$$

Generally, the capacitive component with the FETs off has a low value of several pF or below, but it can be seen from Equation (2) that since the value C2 becomes smaller as the required phase delay quantity decreases or the signal frequency increases, to attain a lower phase-shifting quantity or to phase-shift a signal having a high frequency, the T-type phase delay circuit can be comprised by means of a capacitive component with the FETs off. The operations are the same as in Embodiment 1 except that the capacitor configuring the T-type phase delay circuit is realized by the capacity with the fifth FET 7 off.

Thus, with the configuration as in Embodiment 3, the capacitors to be connected in parallel with the FETs can be eliminated and the circuit can be made compact when it is desired to have a low phase-shifting quantity and to be used at a high frequency. Further, since a parasitic inductor component involved in an extraction line pattern for connecting the capacitors in parallel is eliminated, causes of the degraded frequency characteristics in a high-frequency band can be reduced.

Embodiment 4

Figure 5:
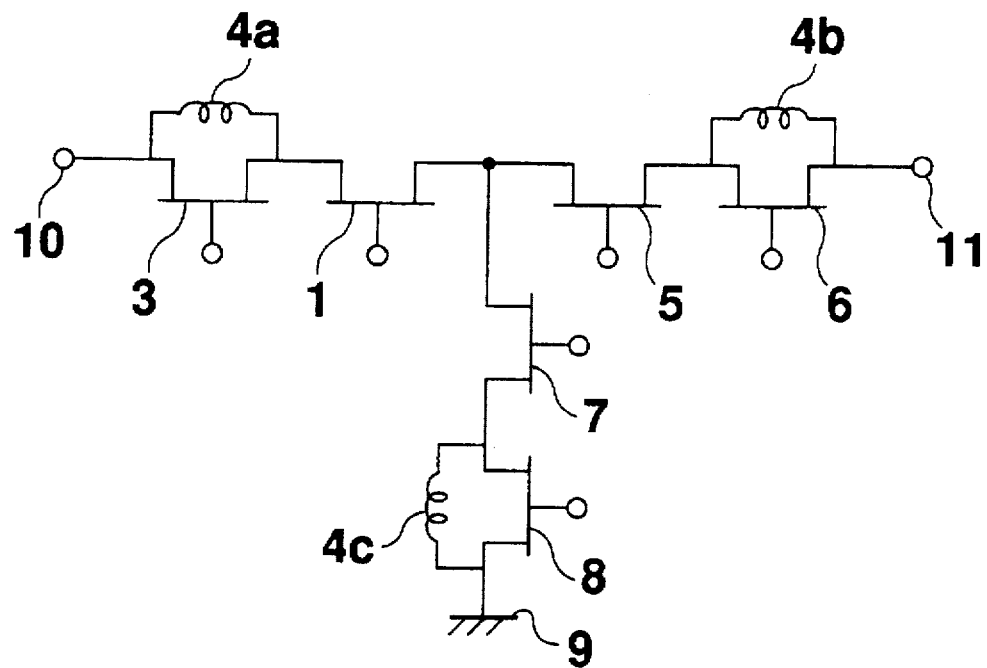
FIG. 5 is circuit diagram showing Embodiment 4 of the invention.

FIG. 5 is a circuit diagram showing Embodiment 4 of the invention. This embodiment is different from Embodiment 1 in that the first capacitor 2a, the second capacitor 2b and the third capacitor 2c are omitted from FIG. 1.

In Embodiment 1, a capacitive component produced between the drain electrode and the source electrode when a pinch-off voltage is applied to the gate electrodes of the FETs, is set to have high impedance or cut off with respect to a passing high frequency signal, and the capacitors connected in parallel with the FETs are used to constitute the T-type phase circuit. Embodiment 4 uses a capacitive component with the FETs off as a capacitor constituting the T-type phase circuit instead of the capacitor 2 in Embodiment 1. As described above, the phase leading quantity θ1 and the phase delay quantity θ2 by the T-type phase circuit shown in FIG. 2A and FIG. 2B are obtained from Equations (1) and (2).

Generally, the capacitive component with the FETs off has a low value of several pF or below, but it can be seen from Equations (1) and (2) that since the values C1 and C2 become smaller as the phase shifter uses a higher frequency, to operate in such a high frequency band, the T-type phase circuit can be formed by means of a capacitive component with the FETs off. The operations are the same as in Embodiment 1 except that the capacitor constituting the T-type phase circuit comprises the capacitance with the first FET 1, the third FET 5 and the fifth FET 7 off.

Thus, with the configuration as in Embodiment 4, the capacitors to be connected in parallel with the FETs can be eliminated and the circuit can be made compact when it is desired to operate the phase shifter in a high frequency band. Further, since a parasitic inductor component involved in an extraction line pattern for connecting the capacitors in parallel is eliminated, causes of the degraded frequency characteristics in a high-frequency band can be reduced.

Embodiment 5

Figure 6:
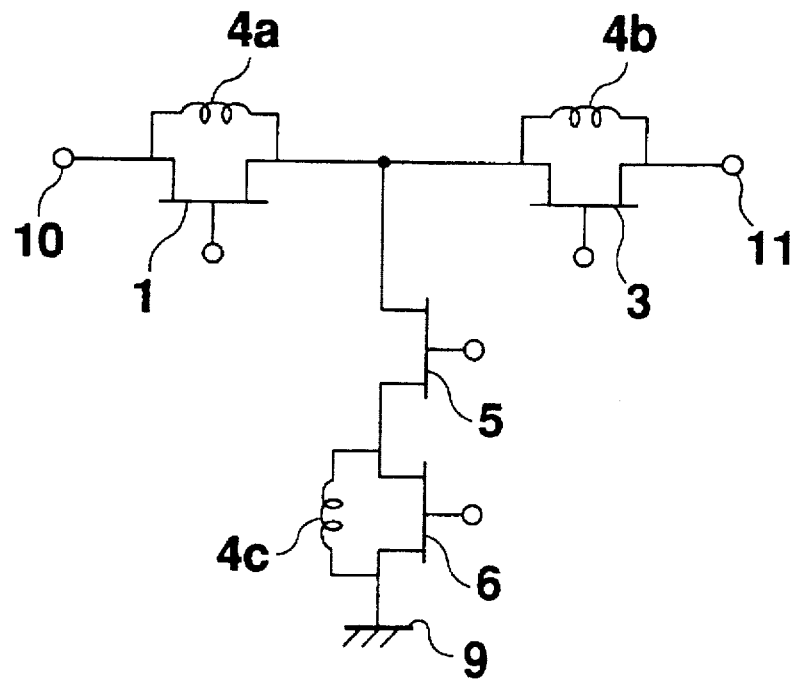
FIG. 6 is a circuit diagram showing Embodiment 5 of the invention.

FIG. 6 is a circuit diagram showing Embodiment 5 of the invention. Embodiment 1 switches between the T-type phase leading circuit and the T-type phase delay circuit with the FETs turned on or off to change the passing phase quantity, while Embodiment 5 switches between the passing circuit and the T-type phase delay circuit.

Figure 7A:
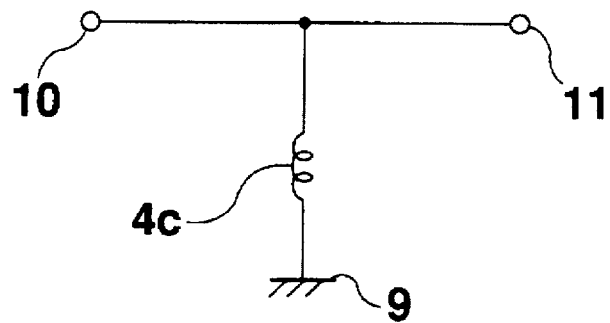
FIG. 7A, FIG. 7B and FIG. 7C are circuit diagrams illustrating the operations of Embodiment 5 of the invention.
Figure 7B:
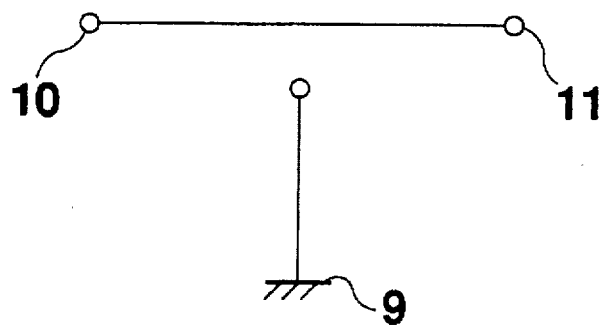

First, the first FET 1, the second FET 3 and the third FET 5 are turned on, and the fourth FET 6 is turned off to constitute a passing circuit. The equivalent circuit under this condition is as shown simply in FIG. 7A because the FETs have fully low impedance with the FETs on and a high-frequency signal passes through the FETs, while the FETs have high impedance with the FETs off and the high-frequency signal is cut off, and a resistance value is sufficiently low with the FETs on. At this time, when a constant of the third inductor 4c is set to provide high impedance for the high-frequency signal, the third inductor 4c works to cut off the high-frequency signal. Specifically, since the third FET 5 and the fourth FET 6, which are connected in parallel with the main line connecting the input terminal 10 and the output terminal 11, are regarded as open ends, the equivalent circuit of FIG. 7A can be regarded as the equivalent circuit of FIG. 7B and works as a passing circuit.

Figure 7C:
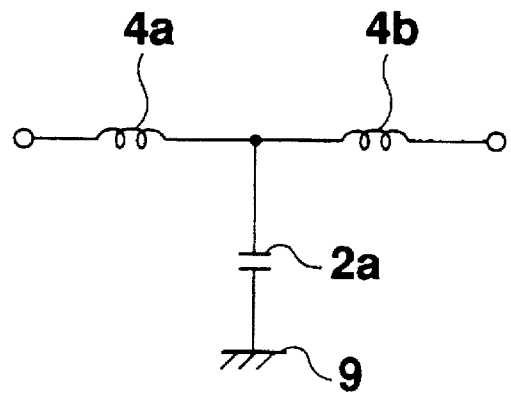

Then, the first FET 1, the second FET 3 and the third FET 5 are turned off, and the fourth FET 6 is turned on to constitute a phase delay circuit. The equivalent circuit under this condition is as simply shown in FIG. 7A because a resistance value is sufficiently low with the FET on. At this time, the first capacitor 2a in FIG. 7C is a capacitive component with the third FET 5 off. Thus, the passing circuit and the T-type phase delay circuit are switched by controlling the on and off conditions of the FETs to effect a phase-shift difference between signals passing both of the above circuits.

In Embodiment 5, since the number of FETs which are connected in parallel with the main line connecting the input terminal 10 and the output terminal 11 is decreased compared with Embodiment 1, the phase shifter can decrease a passing loss and can be made compact.

Embodiment 6

Figure 8:
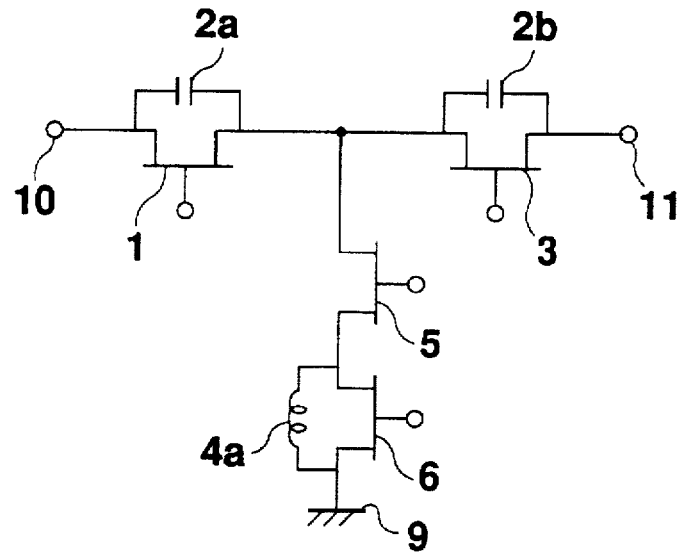
FIG. 8 is a circuit diagram showing Embodiment 6 of the invention.
Figure 9A:
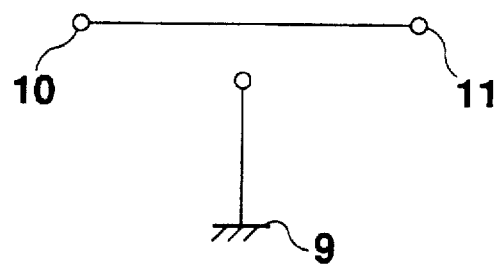
FIG. 9A and FIG. 9B are circuit diagrams describing the operations of Embodiment 6 of the invention.

FIG. 8 is a circuit diagram showing Embodiment 6 of the invention. Embodiment 6 switches between the passing circuit and the T-type phase leading circuit. First, the first FET 1, the second FET 3 and the fourth FET 6 are turned on, and the third FET 5 is turned off to constitute a passing circuit. The equivalent circuit under this condition is as shown simply in FIG. 9A, because the FETs have fully low impedance with the FETs on and a high-frequency signal passes through the FETs, the FETs have high impedance with the FETs off and the high-frequency signal is cut off, and a resistance value is sufficiently low with the FETs on. Thus, since the third FET 5 is regarded as an open end with respect to the main line which connects the input terminal 10 and the output terminal 11, it serves as a passing circuit. At this time, the fourth FET 6 is on in order to prevent the high-frequency signal from being attenuated due to resonance of the capacitive component and the first inductor 4a with the FET 5 off.

Figure 9B:
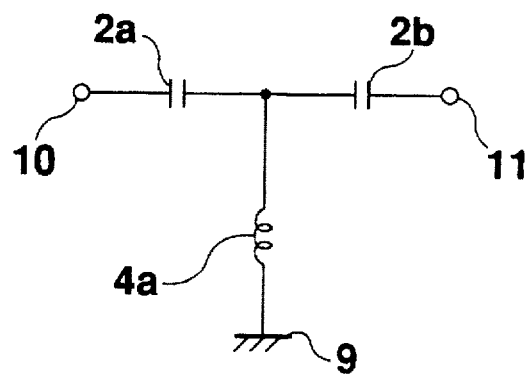

First, the first FET 1, the second FET 3 and the fourth FET 6 are turned off, and the third FET 5 is turned on to constitute a phase leading circuit. The equivalent circuit under this condition is a T-type phase leading circuit as shown simply in FIG. 9B because a resistance value is sufficiently low with the FET on. Thus, the passing circuit and the T-type phase leading circuit are switched by controlling the on and off conditions of the FETs to carry out different phase-shifting for signals passing through the above circuits. In Embodiment 6, since the number of FETs which are connected in parallel with the main line connecting the input terminal 10 and the output terminal 11 is decreased compared with Embodiment 1, the phase shifter can decrease a passing loss and can be made compact.

Embodiment 7

Figure 10:
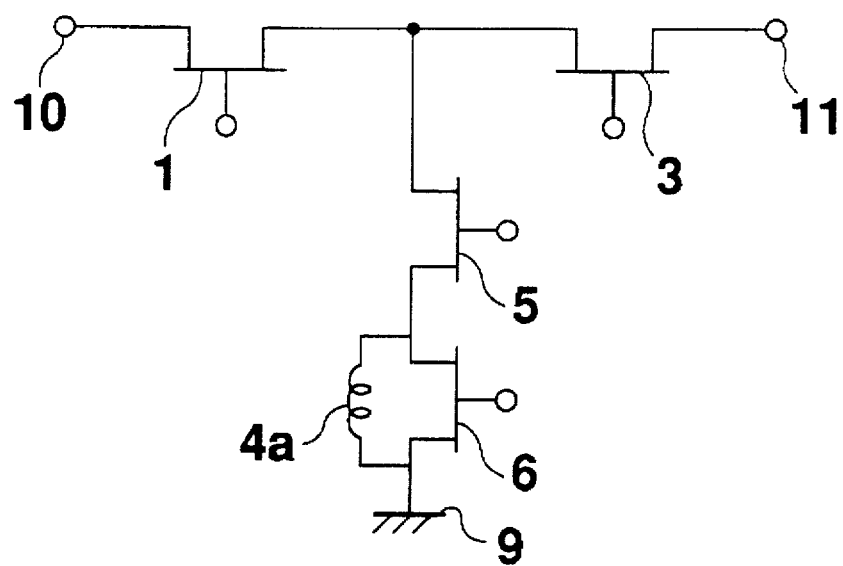
FIG. 10 is a circuit diagram showing Embodiment 7 of the invention.

FIG. 10 is a circuit diagram showing Embodiment 7 of the invention. Embodiment 7 switches between the passing circuit and the T-type phase leading circuit in the same way as in Embodiment 6, but is different from Embodiment 6 in that the first capacitor 2a and the second capacitor 2b are omitted from FIG. 8. Embodiment 6 uses the capacitor connected in parallel with the FET to constitute the T-type phase leading circuit, while Embodiment 7, instead of the first capacitor 2a and the second capacitor 2b of Embodiment 6, uses a capacitive component with the FETs off as a capacitor for constituting a T-type phase leading circuit. The operations are the same as in Embodiment 6 except that the capacitor constituting the T-type phase leading circuit is realized by a capacitance with the first FET 1 and the second FET 3 off. Differing from Embodiment 6, Embodiment 7 does not need a capacitor and can make the circuit small.

Embodiment 8

Figure 11:
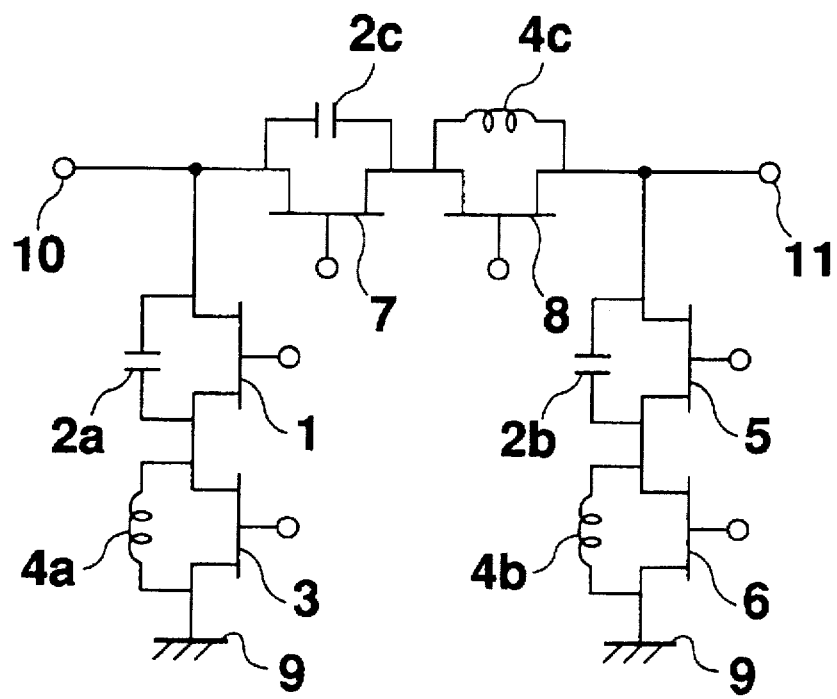
FIG. 11 is a circuit diagram showing Embodiment 8 of the invention.

Description will be given of Embodiment 8 with reference to FIG. 11 and FIG. 12. FIG. 11 is a circuit diagram showing Embodiment 8 of the invention. Embodiment 1 is configured to switch between the T-type phase delay circuit and the T-type phase leading circuit, while Embodiment 8 switches between a π-type phase delay circuit and a π-type phase leading circuit.

Operations will be described with reference to FIG. 11. First, the first FET 1, the third FET 5 and the sixth FET 8 are turned on, and the second FET 3, the fourth FET 6 and the fifth FET 7 are turned off. Then, with the FETs on, the FETs have fully low impedance and a high-frequency signal passes through the FETs, while with the FETs off, the FETs have high impedance and the high-frequency signal passes through the circuit connected in parallel. The equivalent circuit of the phase shifter under this condition is as simply illustrated in FIG. 12A because a resistance value is sufficiently low with the FETs on. Thus, the third capacitor 2c, the first inductor 4a and the second inductor 4b constitute a π-type high-pass filter to operate as a phase leading circuit.

Then, the first FET 1, the third FET 5 and the sixth FET 8 are turned off, and the second FET 3, the fourth FET 6 and the fifth FET 7 are turned on. The equivalent circuit of the phase shifter under this condition is briefly illustrated as in FIG. 12B because a resistance value is sufficiently low with the FETs on. Thus, the third inductor 4c, the first capacitor 2a and the second capacitor 2b constitute a π-type low-pass filter to operate as a phase delay circuit.

Thus, the π-type phase leading circuit and the π-type phase delay circuit are switched by controlling the on and off conditions of the FETs to carry out different phase-shifting for signals passing through the above circuits. Further, since the phase shifter can be configured using concentrated constant elements, the same effects as in Embodiment 1 can be attained.

Embodiment 9

Figure 13:
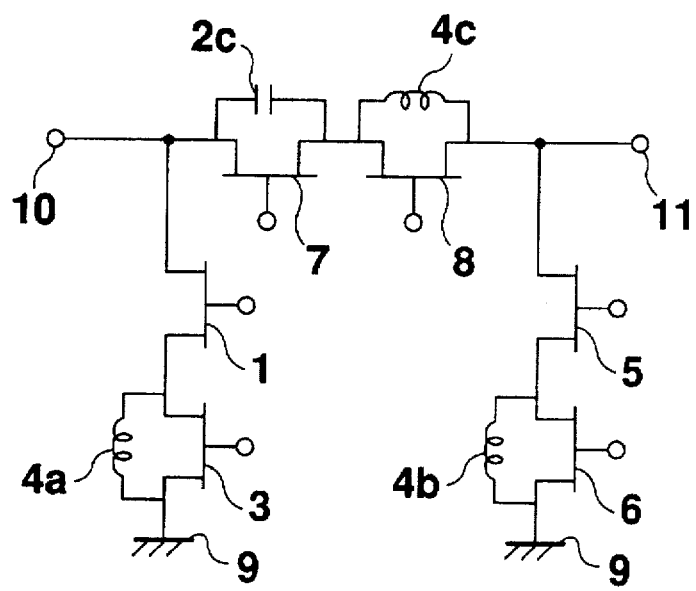
FIG. 13 is a circuit diagram showing Embodiment 9 of the invention.

FIG. 13 is a circuit diagram showing Embodiment 9 of the invention. Embodiment 9 is different from Embodiment 8 in that the first capacitor 2a and the second capacitor 2b are omitted from FIG. 11.

Figure 12A:
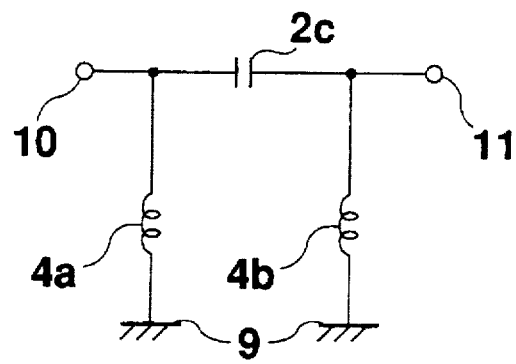
FIG. 12A and FIG. 12B are circuit diagrams illustrating the operations of Embodiment 8 of the invention.
Figure 12B:
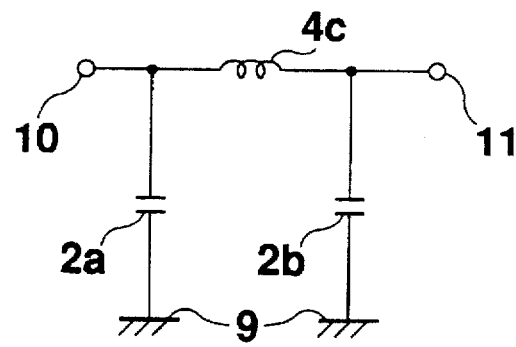

In Embodiment 8, a capacitive component produced between the drain electrode and the source electrode when a pinch-off voltage is applied to the gate electrodes of the FETs, is set to have high impedance or cut off with respect to a passing high frequency signal, and the capacitors connected in parallel with the FETs are used to constitute the π-type phase delay circuit. Embodiment 9 uses a capacitive component with the FETs off as a capacitor constituting the π-type phase delay circuit instead of the first capacitor 2a and the second capacitor 2b in Embodiment 8. On the assumption that a phase delay quantity by the π-type phase delay circuit shown in FIG. 12B is θ3 and a frequency is f, a capacitance value C3 of the first capacitor 2a and the second capacitor 2b is known to be expressed as follows:

$$C3 = \frac{\tan(\theta 3/2)}{50 \cdot 2 \cdot \pi \cdot f} \text{ [pF]} \quad (3)$$

Generally, the capacitive component with the FETs off has a low value of several pF or below, but it can be seen from Equation (3) that since the value C3 becomes smaller as the required phase delay quantity decreases or the signal frequency increases, to attain a lower phase-shifting quantity or to phase-shift a signal having a high frequency, the π-type phase delay circuit can be configured by using a capacitive component with the FETs off. Further, the capacitive component depends on the total gate electrode length of the FETs and can have a desired capacitance value owing to the setting of the total gate electrode length. The operations are the same as in Embodiment 1 except that the capacitor constituting the π-type phase delay circuit is realized by the capacitance with the first FET 1 and the third FET 5 off.

Thus, with the configuration as in Embodiment 9, the capacitors to be connected in parallel with the FETs can be eliminated and the circuit can be made compact when it is desired to have a low phase-shifting quantity and to be used at a high frequency. Further, since a parasitic inductor component involved in an extraction line pattern for connecting the capacitors in parallel is eliminated, causes of the degraded frequency characteristics in a high-frequency band can be reduced.

Embodiment 10

Figure 14:
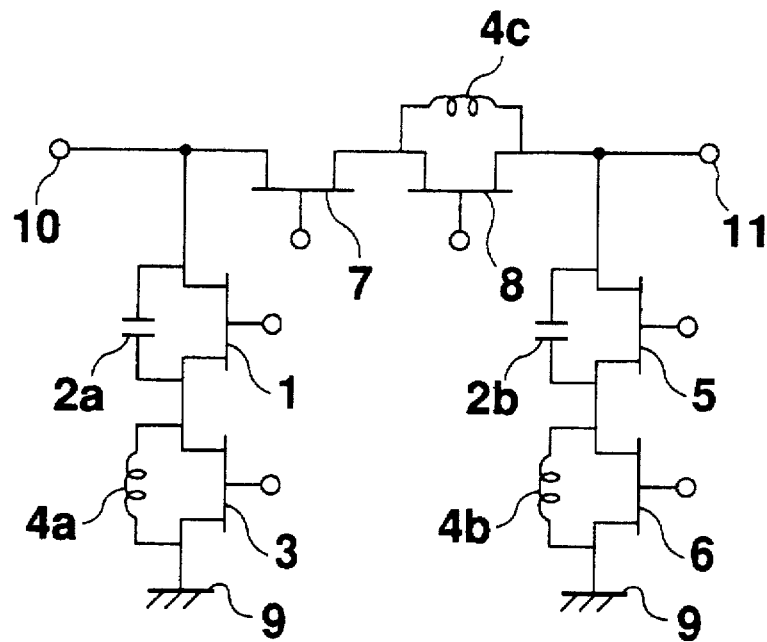
FIG. 14 is a circuit diagram showing Embodiment 10 of the invention.

FIG. 14 is a circuit diagram showing Embodiment 10 of the invention. Embodiment 10 is different from Embodiment 8 in that the third capacitor 2a is omitted from FIG. 11.

In Embodiment 8, a capacitive component produced between the drain electrode and the source electrode when a pinch-off voltage is applied to the gate electrodes of the FETs, is set to have high impedance or cut off with respect to a passing high frequency signal, and the capacitors connected in parallel with the FETs are used to configure a π-type phase leading circuit. Embodiment 10 uses a capacitive component with the FETs off as a capacitor constituting the π-type phase leading circuit instead of the third capacitor 2c in Embodiment 8. On the assumption that a phase leading quantity by the π-type phase leading circuit shown in FIG. 12A is θ4 and a frequency is f, a capacitance value C4 of the third capacitor 2c is known to be expressed as follows:

$$C4 = \frac{1}{50 \cdot 2 \cdot \pi \cdot f \cdot \sin(\theta 4)} \text{ [pF]} \quad (4)$$

Generally, the capacitive component with the FETs off has a low value of several pF or below, but it can be seen from Equation (4) that since the value C4 becomes smaller as the required phase leading quantity increases or the signal frequency increases, to attain a higher phase-shifting quantity or to phase-shift a signal having a high frequency, the π-type phase leading circuit can be comprised of a capacitive component with the FETs off. The operations are the same as in Embodiment 8 except that the capacitor constituting the π-type phase leading circuit is realized by the capacitance with the fifth FET 7 off.

Thus, with the configuration as in Embodiment 10, the capacitors to be connected in parallel with the FETs can be eliminated and the circuit can be made compact when it is desired to have a low phase-shifting quantity and to be used at a high frequency. Further, since a parasitic inductor component involved in an extraction line pattern for connecting the capacitors in parallel is eliminated, causes of the degraded frequency characteristics in a high-frequency band can be reduced.

Embodiment 11

Figure 15:
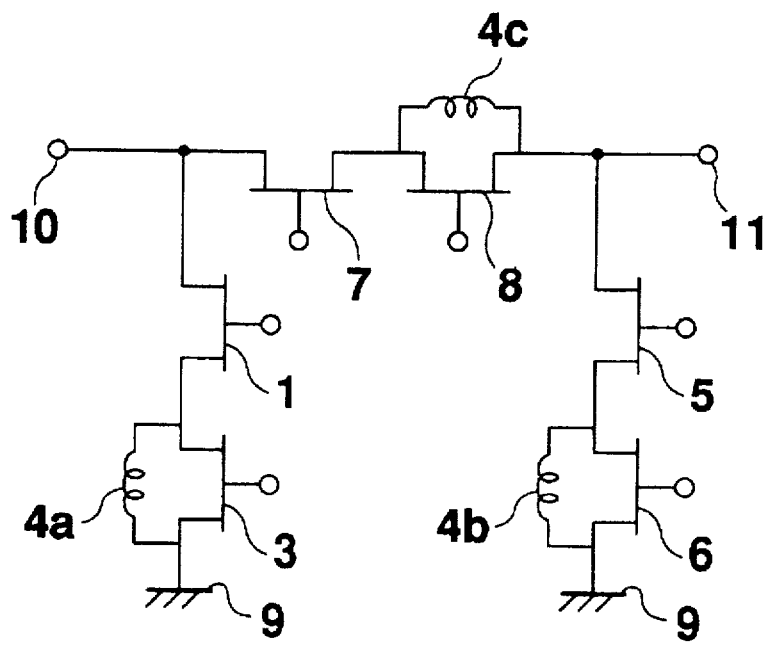
FIG. 15 is a circuit diagram showing Embodiment 11 of the invention.

FIG. 15 is a circuit diagram showing Embodiment 11 of the invention. Embodiment 11 is different from Embodiment 8 in that the first capacitor 2a, the second capacitor 2b and the third capacitor 2c are omitted from FIG. 11.

In Embodiment 8, a capacitive component, produced between the drain electrode and the source electrode when a pinch-off voltage is applied to the gate electrodes of the FETs, is set to have high impedance or cut off with respect to a passing high frequency signal, and the capacitors connected in parallel with the FETs are used to constitute the π-type phase circuits. Embodiment 11 uses a capacitive component with the FETs off as a capacitor constituting the π-type phase circuits instead of the capacitors 2 in Embodiment 8. As described above, the phase delay quantity θ3 and the phase leading quantity θ4 by the π-type phase circuit shown in FIG. 12A and FIG. 12B are obtained from Equations (3) and (4).

Generally, the capacitive component with the FETs off has a low value of several pF or below, but it can be seen from Equations (3) and (4) that since the values C3 and C4 become smaller as the phase shifter uses a higher frequency, to operate in such a high frequency band, the π-type phase circuit can be comprised of a capacitive component with the FETs off. The operations are the same as in Embodiment 8 except that the capacitor constituting the π-type phase circuit is comprised of the capacitance with the first FET 1, the third FET 5 and the fifth FET 7 off.

Thus, with the configuration as in Embodiment 11, the capacitors to be connected in parallel with the FETs can be eliminated and the circuit can be made compact when it is desired to operate the phase shifter in a high frequency band. Further, since a parasitic inductance component involved in an extraction line pattern for connecting the capacitors in parallel is eliminated, causes of the degraded frequency characteristics in a high-frequency band can be reduced.

Embodiment 12

Figure 16:
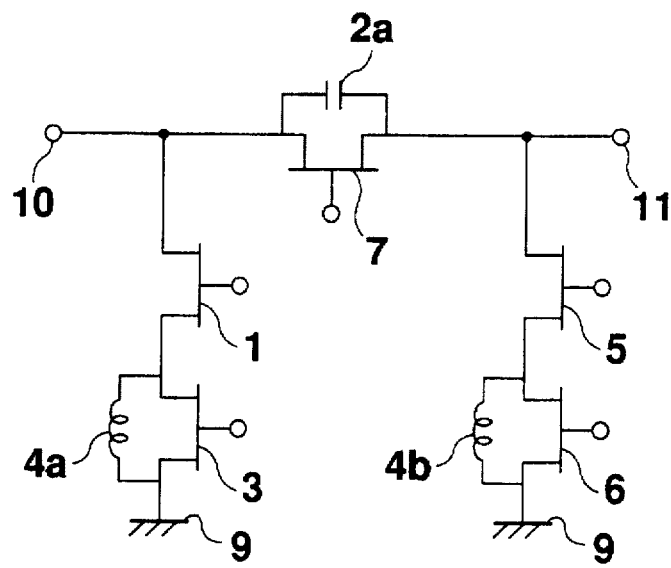
FIG. 16 is a circuit diagram showing Embodiment 12 of the invention.

FIG. 16 is a circuit diagram showing Embodiment 12 of the invention. Embodiment 8 switches between the π-type phase leading circuit and the π-type phase delay circuit with the FETs turned on or off to change the passing phase quantity, while Embodiment 12 switches between the passing circuit and the π-type phase leading circuit.

Figure 17A:
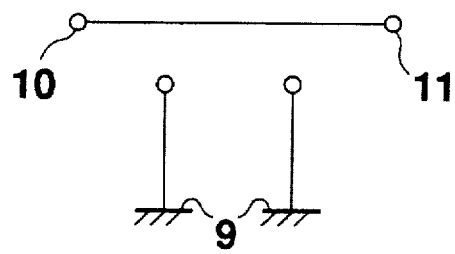
FIG. 17A and FIG. 17B are circuit diagrams illustrating the operation of Embodiment 12 of the invention.

First, the second FET 3, the fourth FET 6 and the fifth FET 7 are turned on, and the first FET 1 and the third FET 5 are turned off to constitute the passing circuit. The equivalent circuit under this condition is simply illustrated in FIG. 17A because the FETs have fully low impedance with the FETs on and a high-frequency signal passes through the FETs, the FETs have high impedance with the FETs off and the high-frequency signal is cut off, and a resistance value is sufficiently low with the FETs on. Thus, since the first FET 1 and the third FET 5 are regarded as open ends with respect to the main line which connects the input terminal 10 and the output terminal 11, they serve as a passing circuit. At this time, the second FET 3 and the fourth FET 6 are on in order to prevent the high-frequency signal from being attenuated due to resonance of the capacitive component and the first inductor 4a with the first FET 1 off and to prevent the high-frequency signal from being attenuated due to resonance of the capacitive component and the second inductor 4b with the third FET 5 off.

Figure 17B:
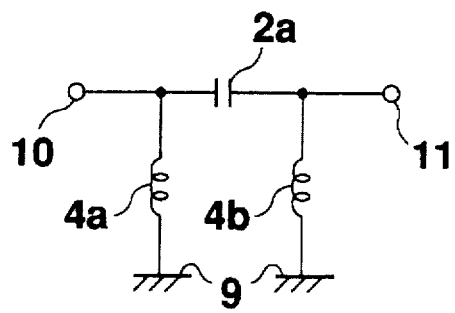

Then, the second FET 3, the fourth FET 6 and the fifth FET 7 are turned off, and the first FET 1 and the third FET 5 are turned on to constitute a phase leading circuit. The equivalent circuit under this condition is simply illustrated as a π-type phase leading circuit, as shown in FIG. 17B, because a resistance value is sufficiently low with the FETs on. Thus, the passing circuit and the π-type phase leading circuit are switched by controlling the on and off conditions of the FETs to carry different phase-shifting for signals passing through the above circuits.

In Embodiment 12, since the number of FETs which are connected in series with the main line connecting the input terminal 10 and the output terminal 11 is decreased compared with Embodiment 8, the phase shifter can decrease a passing loss and be made compact.

Embodiment 13

Figure 18:
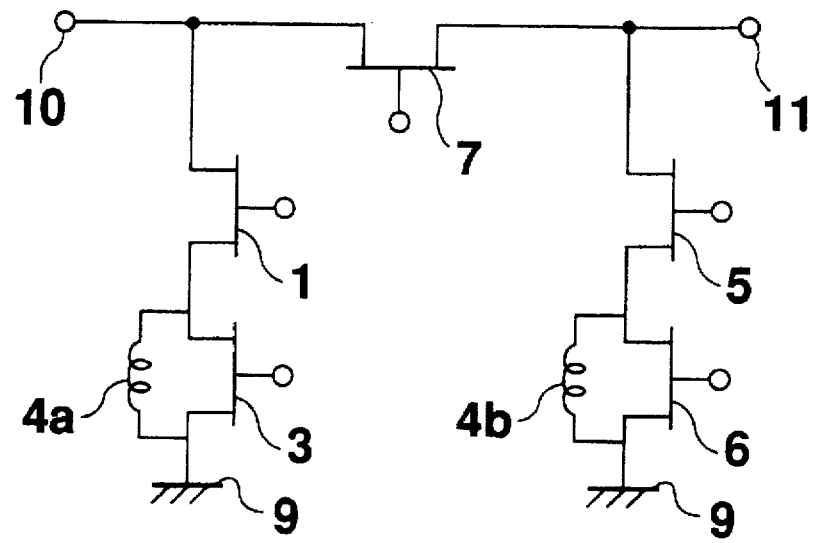
FIG. 18 is a circuit diagram showing Embodiment 13 of the invention.

FIG. 18 shows a circuit diagram showing Embodiment 13 of the invention. Embodiment 13 switches between the passing circuit and the π-type phase leading circuit in the same way as in Embodiment 12, and is different from Embodiment 12 in that the first capacitor 2a is omitted from FIG. 16. Embodiment 12 uses the capacitor connected in parallel with the FET to constitute the π-type phase leading circuit, while instead of the first capacitor 2a of Embodiment 12, Embodiment 13 uses a capacitive component with the FETs off as a capacitor for constituting a π-type phase leading circuit. The operations are the same as in Embodiment 12 except that the capacitor configuring the π-type phase leading circuit is realized by a capacitance with the fifth FET 7 off. Differing from Embodiment 12, Embodiment 13 does not need a capacitor and can make the circuit smaller.

Embodiment 14

Figure 19:
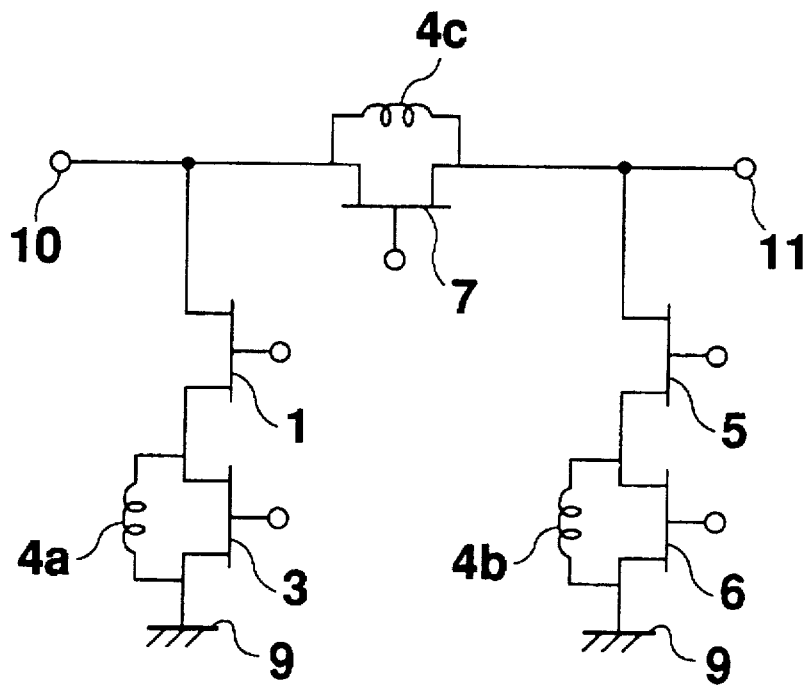
FIG. 19 is a circuit diagram showing Embodiment 14 of the invention.

FIG. 19 is a circuit diagram showing Embodiment 14 of the invention. Embodiment 8 switches between the π-type phase leading circuit and the π-type phase delay circuit with the FETs turned on or off to change the passing phase quantity, while Embodiment 14 switches between the passing circuit and the π-type phase delay circuit.

Figure 20A:
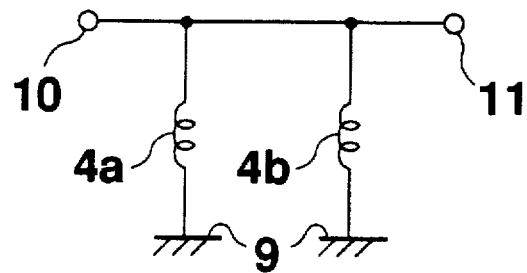
FIG. 20A, FIG. 20B and FIG. 20C are circuit diagrams illustrating the operations of Embodiment 14 of the invention.
Figure 20B:
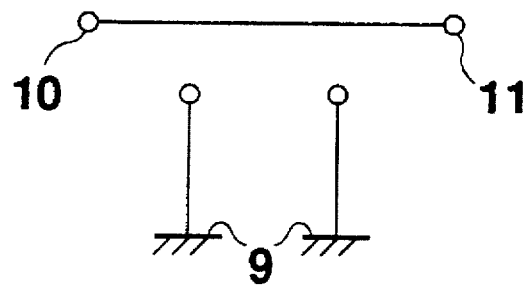

First, the first FET 1, the third FET 5 and the fifth FET 7 are turned on, and the second FET 3 and the fourth FET 6 are turned off to constitute a passing circuit. The equivalent circuit under this condition is as simply shown in FIG. 20A, because the FETs have fully low impedance with the FETs on and a high-frequency signal passes through the FETs, the FETs have high impedance with the FETs off and the high-frequency signal is cut off, and a resistance value is sufficiently low with the FETs on. At this time, when constants of the first inductor 4a and the second inductor 4b are set to provide high impedance for the high-frequency signal, the first inductor 4a and the second inductor 4b work to cut off the high-frequency signal. Specifically, since the first FET 1 and the third FET 5, which are connected in parallel with the main line connecting the input terminal 10 and the output terminal 11, are regarded as open ends, the equivalent circuit of FIG. 20A can be regarded as the equivalent circuit of FIG. 20B and works as a passing circuit.

Figure 20C:
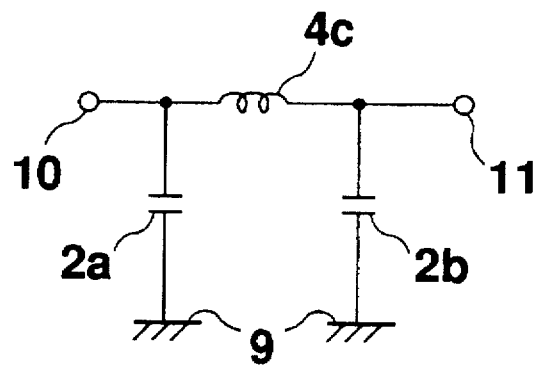

Then, the first FET 1, the third FET 5 and the fifth FET 7 are turned off, and the second FET 3 and the fourth FET 6 are turned on to constitute a phase delay circuit. The equivalent circuit under this condition is as simply shown in FIG. 20C because a resistance value is sufficiently low with the FETs on and works as the phase delay circuit. At this time, the first capacitor 2a in FIG. 20C is a capacitive component with the first FET 1 off, and the second capacitor 2b is a capacitive component with the third FET 5 off. Thus, the passing circuit and the π-type phase delay circuit are switched by controlling the on and off conditions of the FETs to effect different phase-shifting for signals passing through each of the above circuits.

In Embodiment 14, since the number of FETs which are connected in series with the main line connecting the input terminal 10 and the output terminal 11 is decreased compared with Embodiment 8, the phase shifter can decrease a passing loss and can be made compact.

Embodiment 15

Figure 21:
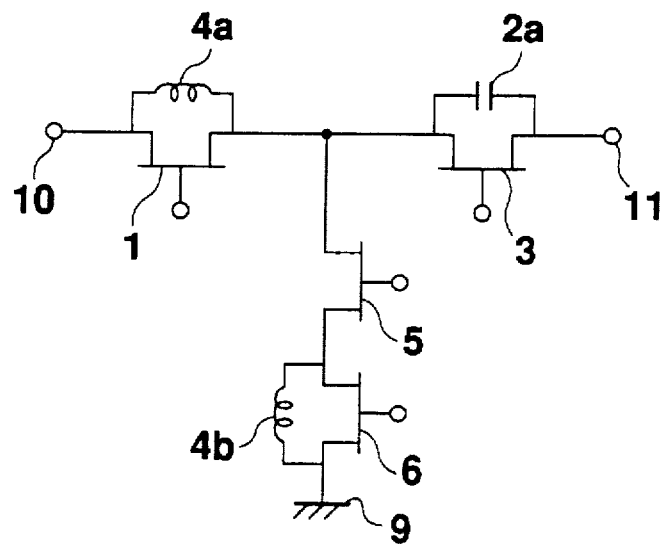
FIG. 21 is a circuit diagram showing Embodiment 15 of the invention.
Figure 22A:
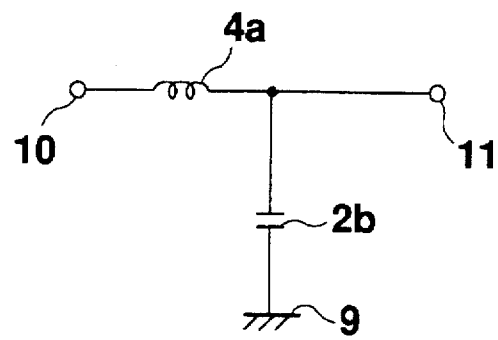
FIG. 22A and FIG. 22B are circuit diagrams illustrating the operations of Embodiment 15 of the invention.
Figure 22B:
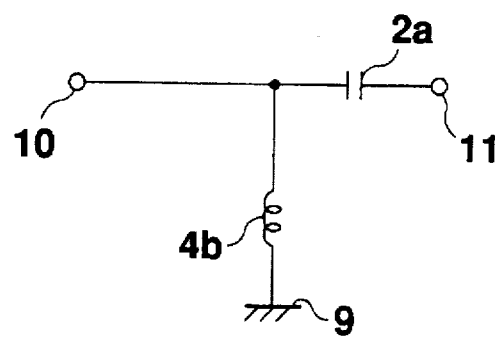

Description will be given of Embodiment 15 with reference to FIG. 21 and FIG. 22. FIG. 21 is a circuit diagram showing Embodiment 15 of the invention. Embodiment 1 is configured to switch between the T-type phase delay circuit and the T-type phase leading circuit, while Embodiment 15 switches between an LC phase delay circuit and an LC phase leading circuit using an inductor L and a capacitor C.

First, the second FET 3 and the fourth FET 6 are turned on, and the first FET 1 and the third FET 5 are turned off. Then, with the FETs on, the FETs have fully low impedance and a high-frequency signal passes through the FETs, and with the FETs off, the FETs have high impedance and the high-frequency signal passes through the circuit connected in parallel. The equivalent circuit of the phase shifter under this condition is as shown simply in FIG. 22A because a resistance value is sufficiently low with the FETs on. Thus, the first inductor 4a and the second capacitor 2b, together with a capacitive component with the third FET 5 off, constitute an LC low-pass filter to operate as a phase delay circuit.

Then, the second FET 3 and the fourth FET 6 are turned off, and the first FET 1 and the third FET 5 are turned on. The equivalent circuit of the phase shifter under this condition is as shown simply in FIG. 22B because a resistance value is sufficiently low with the FETs on. Thus, the second inductor 4b and the first capacitor 2a constitute an LC high-pass filter to operate as a phase leading circuit.

Thus, the LC phase leading circuit and the LC phase delay circuit are switched by controlling the on and off conditions of the FETs to effect different phase-shifting for signals passing through each of the above circuits. Further, since the phase shifter can be configured using concentrated constant elements, the same effects as in Embodiment 1 can be attained. Since the number of FETs which are connected in series with the main line connecting the input terminal 10 and the output terminal 11 is decreased compared with Embodiment 1, the phase shifter can decrease a passing loss and can be made compact.

Embodiment 16

Figure 23:
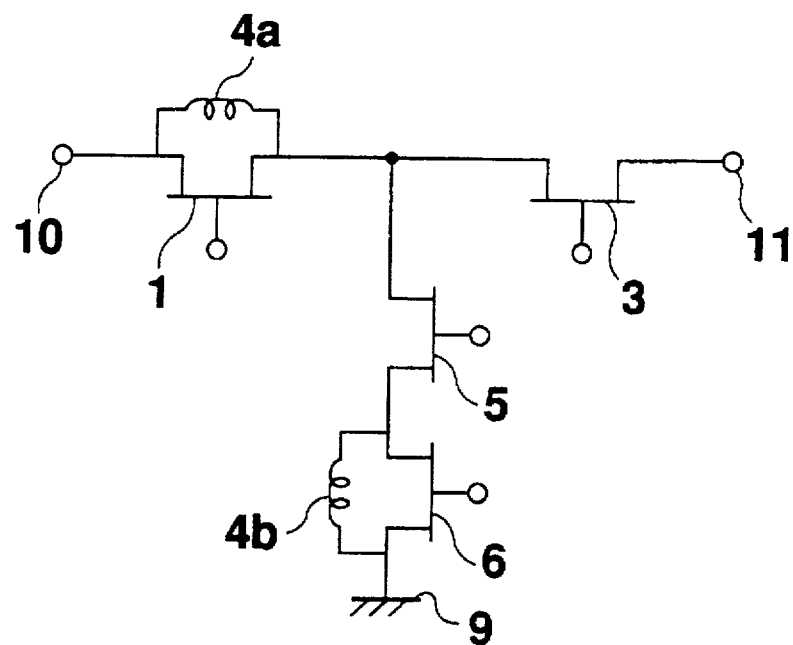
FIG. 23 is a circuit diagram showing Embodiment 16 of the invention.

FIG. 23 is a circuit diagram showing Embodiment 16 of the invention. Embodiment 16 is different from Embodiment 15 in that the first capacitor 2a is omitted from FIG. 21.

In Embodiment 15, a capacitive component produced between the drain electrode and the source electrode when a pinch-off voltage is applied to the gate electrodes of the FETs, is set to have high impedance or cut off with respect to a passing high frequency signal, and the capacitors connected in parallel with the FETs are used to constitute the LC phase leading circuit. Embodiment 16 uses a capacitive component with the FETs off as a capacitor constituting the LC phase leading circuit instead of the first capacitor 2a in Embodiment 15. The operations are the same as in Embodiment 15 except that the capacitor constituting the LC phase leading circuit is realized by the capacity with the second FET 3 off. Differing from Embodiment 15, Embodiment 16 does not need a capacitor and can make the circuit smaller.

Embodiment 17

Figure 24:
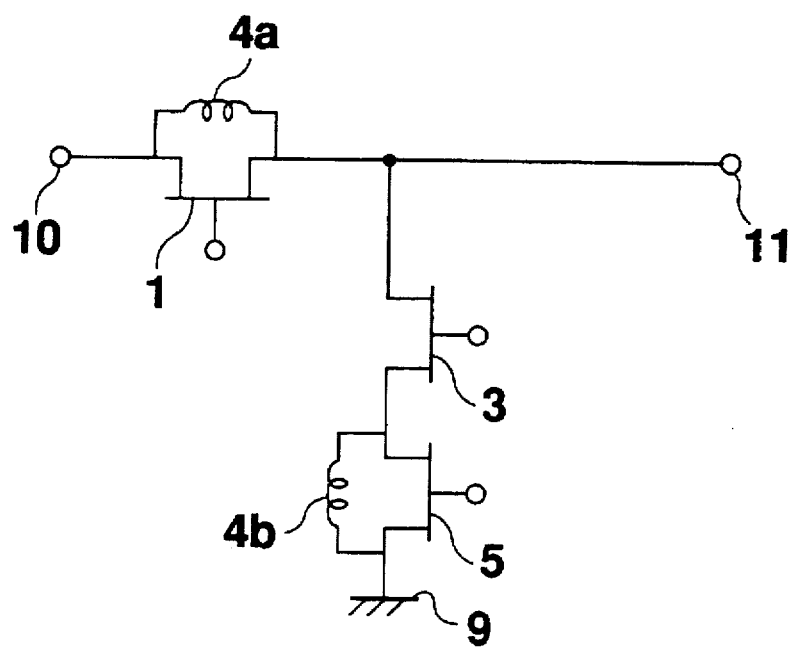
FIG. 24 is a circuit diagram showing Embodiment 17 of the invention.

FIG. 24 is a circuit diagram showing Embodiment 17 of the invention. Embodiment 15 switches between the LC phase leading circuit and the LC phase delay circuit with the FETs turned on or off to change the passing phase quantity, while Embodiment 17 switches between the passing circuit and the LC phase delay circuit.

Figure 25A:
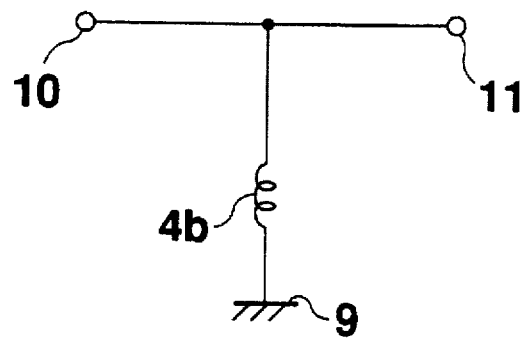
FIG. 25A, FIG. 25B and FIG. 25C are circuit diagrams illustrating the operations of Embodiment 17 of the invention.
Figure 25B:
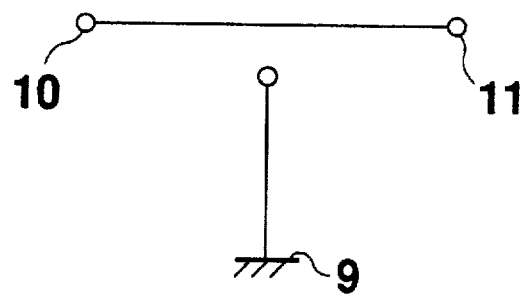

First, the first FET 1 and the second FET 3 are turned on, and the third FET 5 is turned off to constitute a passing circuit. The equivalent circuit under this condition is as shown simply in FIG. 25A because the FETs have fully low impedance with the FETs on and a high-frequency signal passes through the FETs, the FETs have high impedance with the FETs off and the high-frequency signal is cut off, and a resistance value is sufficiently low with the FETs on. At this time, when a constant of the second inductor 4b is set to provide high impedance for the high-frequency signal, the second inductor 4b works to cut off the high-frequency signal. Specifically, since the second FET 3, which is connected in parallel to the main line connecting the input terminal 10 and the output terminal 11, is regarded as an open end, the equivalent circuit of FIG. 25A can be regarded as the equivalent circuit of FIG. 25B and works as a passing circuit.

Figure 25C:
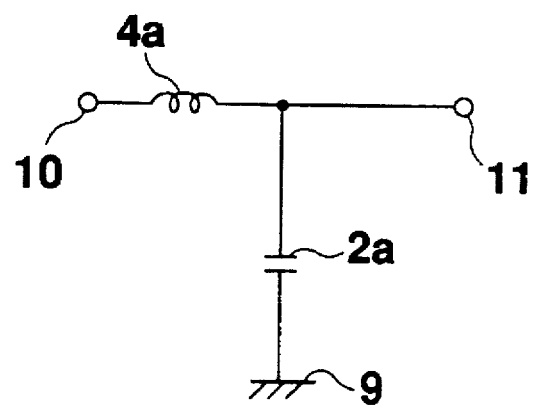

Then, the first FET 1 and the second FET 3 are turned off, and the third FET 5 is turned on to constitute a phase delay circuit. The equivalent circuit under this condition is as shown simply in FIG. 25C because a resistance value is sufficiently low with the FETs on. At this time, the first capacitor 2a in FIG. 25C is a capacitive component with the second FET 3 off. Thus, the passing circuit and the LC phase delay circuit are switched by controlling the on and off conditions of the FETs to effect different phase-shifting for signals passing through each of the above circuits.

In Embodiment 17, since the number of FETs which are connected in series with the main line connecting the input terminal 10 and the output terminal 11 is decreased compared with Embodiment 15, the phase shifter can decrease a passing loss and can be made compact.

Embodiment 18

Figure 26:
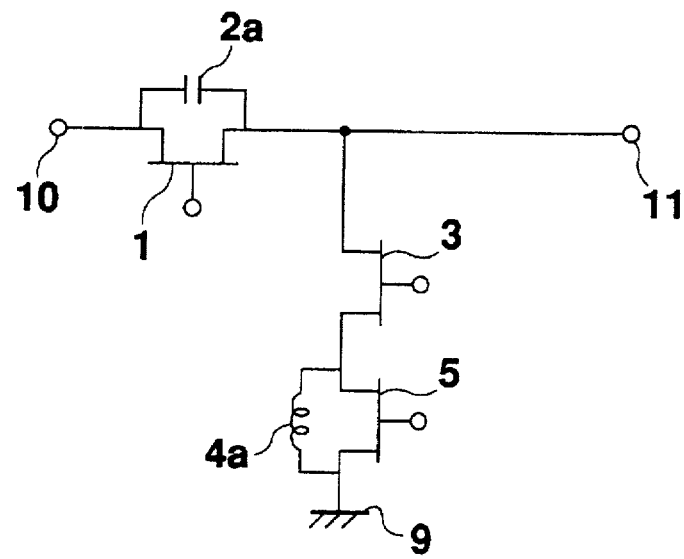
FIG. 26 is a circuit diagram showing Embodiment 18 of the invention.
Figure 27A:
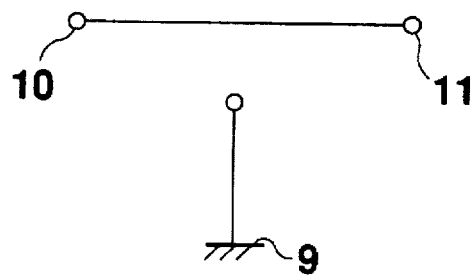
FIG. 27A and FIG. 27B are circuit diagrams illustrating the operation of Embodiment 18 of the invention.

FIG. 26 is a circuit diagram showing Embodiment 18 of the invention. Embodiment 18 switches between the passing circuit and the LC phase leading circuit. First, the first FET 1 and the third FET 5 are turned on, and the second FET 3 is turned off to constitute a passing circuit. The equivalent circuit under this condition is as shown simply in FIG. 27A because the FETs have fully low impedance with the FETs on and a high-frequency signal passes through the FETs, the FETs have high impedance with the FETs off and the high-frequency signal is cut off, and a resistance value is sufficiently low with the FETs on. Since the second FET 3 is regarded as an open end with respect to the main line connecting the input terminal 10 and the output terminal 11, it works as a passing circuit. The third FET 5 is kept on in order to prevent a high-frequency signal from attenuating due to resonance of the first inductor 4a and the capacitive component with the second FET 3 off.

Figure 27B:
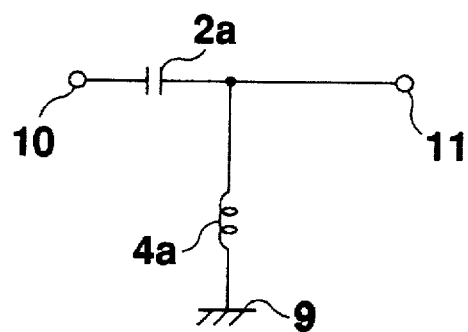

Then, the first FET 1 and the third FET 5 are turned off, and the second FET 3 is turned on to constitute a phase leading circuit. The equivalent circuit under this condition is as shown simply in FIG. 27B because a resistance value is sufficiently low with the FET on. Thus, the passing circuit and the phase leading circuit are switched by controlling the on and off conditions of the FETs to effect different phase-shifting for signals passing through of the above circuits. In Embodiment 18, since the number of FETs which are connected in series with the main line connecting the input terminal 10 and the output terminal 11 is decreased compared with Embodiment 15, the phase shifter can decrease a passing loss and can be made compact.

Embodiment 19

Figure 28:
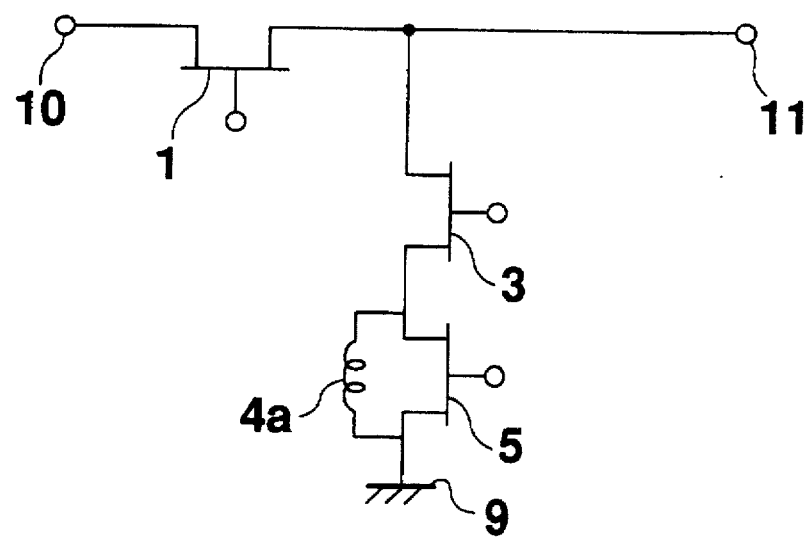
FIG. 28 is a circuit diagram showing Embodiment 19 of the invention.

FIG. 28 is a circuit diagram showing Embodiment 19 of the invention. Embodiment 19 switches between the passing circuit and the LC phase leading circuit in the same way as in Embodiment 18 except that the first capacitor 2a of FIG. 24 is omitted. Embodiment 18 uses the capacitor connected in parallel with the FET to constitute the LC phase leading circuit, while Embodiment 19 uses a capacitive component with the FETs off as a capacitor which constitutes the LC phase leading circuit instead of the first capacitor 2a in Embodiment 18. The operations are the same as in Embodiment 18 except that the capacitor configuring the LC phase leading circuit is realized by the capacitance with the first FET 1 off. Differing from Embodiment 18, Embodiment 19 does not need a capacitor and can make the circuit smaller.

Embodiment 20

Figure 29:
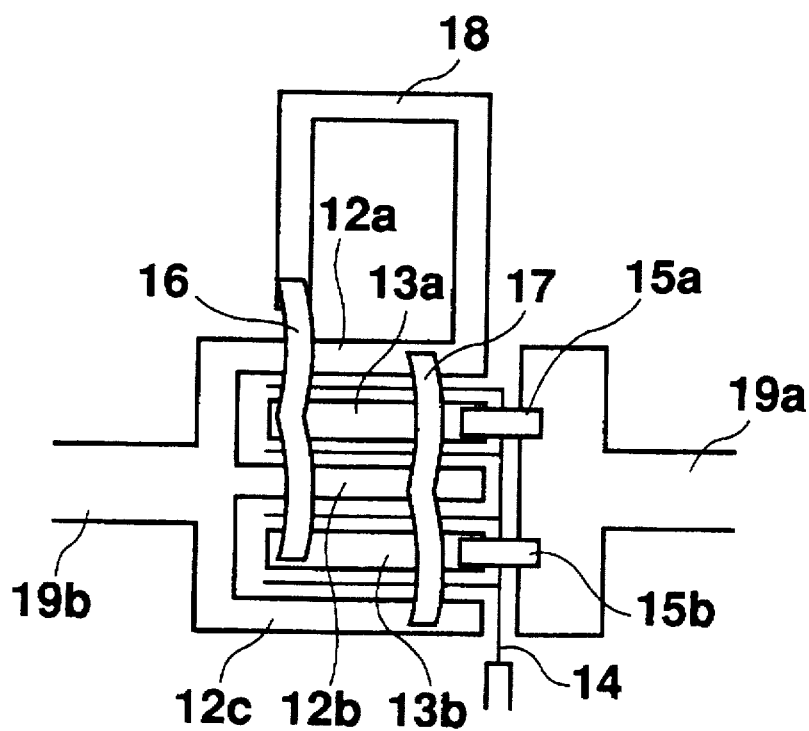
FIG. 29 is a structural diagram showing Embodiment 20 of the invention.

FIG. 29 is a circuit diagram showing Embodiment 20 of the invention, showing the second FET 3 connected to the first inductor 4a of FIG. 1 described in Embodiment 1. In FIG. 29, the second FET 3 is formed by arranging strip-shaped drain electrode patterns 12 and strip-shaped source electrode patterns 13 in a form as if a plurality of comb teeth are interlaced with one another (interdigital) and a gate electrode pattern 14 is inserted between the drain electrode patterns 12 and the source electrode patterns 13. The gate electrode patterns 14 are connected together and to an external lead. The source electrode patterns 13 are connected to a connection pattern 19a for other FETs through air bridges 15a to avoid interference with the gate electrode pattern 14.

Reference numeral 18 designates an inductor line pattern which corresponds to the first inductor 4a shown in FIG. 1. One end of the inductor line pattern 18 is connected to the leading end of a drain electrode pattern 12a, and the other end to the leading end of a source electrode pattern 13a through an air bridge 16. The plurality of drain electrode patterns 12 formed like the teeth of a comb are mutually connected by an air bridge 17, and the source electrode patterns 13 are mutually connected by the air bridge 16.

With the above configuration, the inductor line pattern 18 can have its area made smaller than when both its ends are extended from connection patterns 19a, 19b for adjacent FETs. Further, since electrical interference with adjacent circuits can be reduced, stable electrical characteristics are attained without being affected by the arrangement of the inductor line pattern 18.

Generally, inductor capacity which is required to obtain a desired phase-shifting quantity has a smaller value as a frequency used is increased. Thus, when configured as shown in FIG. 29, the inductor line pattern 18 can be made shorter, so that a limitation on the inductor capacity being designed can be reduced, and a phase shifter obtained operates stably at a high frequency.

Description has been made in connection with the structure of the inductor 4a of FIG. 1, but other inductors which have the same configuration can be operated in the same way. In FIG. 29, the drain electrode patterns 12 are mutually connected by the air bridge 17 and the source electrode patterns 13 are mutually connected by the air bridge 16. To reduce a parasitic inductance component due to the air bridges 16, 17, both ends of the inductor line pattern 18 can be connected to not all but at least one of the drain electrode patterns 12 and to not all but at least one of the source electrode patterns 13.

Embodiment 21

Figure 30:
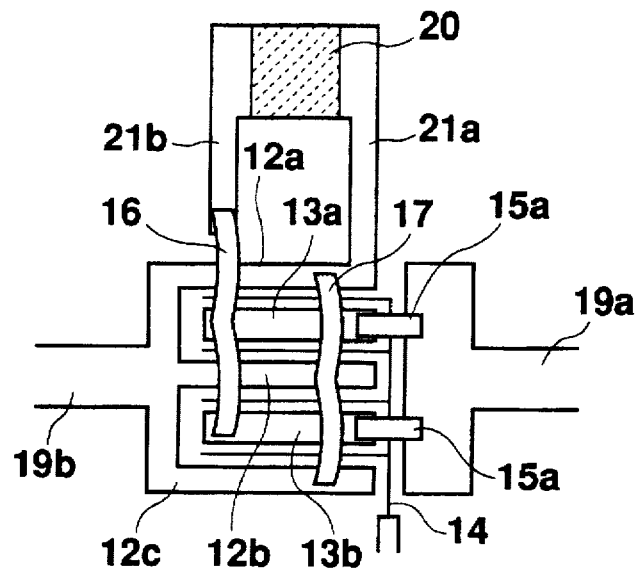
FIG. 30 is a structural diagram showing Embodiment 21 of the invention.

FIG. 30 is a structural diagram showing Embodiment 21 of the invention, showing the first FET 1 connected to the first capacitor 2a of FIG. 1 described in Embodiment 1. In FIG. 30, the first FET 1 has the same electrode structure as the second FET 3 described in Embodiment 20. Reference numeral 20 designates an MIM capacitor which corresponds to the first capacitor 2a shown in FIG. 1. The MIM capacitor 20 is connected to the second FET 3 by means of terminal line patterns 21.

A terminal line pattern 21a is connected to the leading end of the drain electrode pattern 12a and a terminal line pattern 21b to the leading end of the source electrode pattern 13a through the air bridge 16. The plurality of drain electrode patterns 12 formed like the teeth of a comb are mutually connected by the air bridge 17, and the source electrode patterns 13 are mutually connected by the air bridge 16.

With the above configuration, the terminal line patterns 21 can be made as short as possible and made smaller than when they are extended from the connection patterns 19a, 19b for adjacent FETs. Further, a parasitic inductor component involved with the terminal line patterns 21 which deteriorates a frequency characteristic can be reduced, and electrical interference with circuits connected to adjacent FETs can also be reduced.

Description has been given in connection with the first capacitor 21 of FIG. 1, but other capacitors which have the same configuration can be operated in the same way. In FIG. 30, the drain electrode patterns 12 are mutually connected by the air bridge 17 and the source electrode patterns 13 are mutually connected by the air bridge 16. To reduce a parasitic inductance component due to the air bridges 16, 17, the terminal line patterns 21 can be connected to at least one of the drain electrode patterns 12 and to at least one of the source electrode patterns 13.

Embodiment 22

Figure 31:
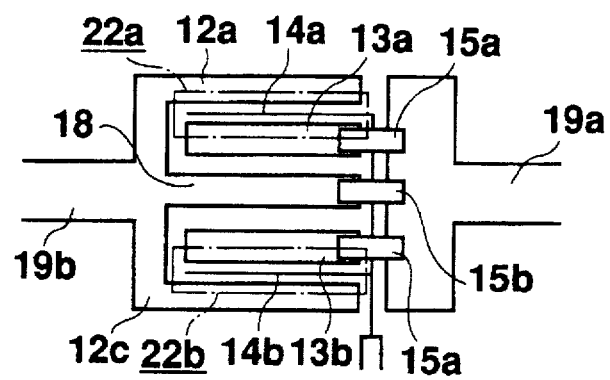
FIG. 31 is a structural diagram showing Embodiment 22 of the invention.

FIG. 31 is a circuit diagram showing Embodiment 22 of the invention, showing the second FET 3 connected to the first inductor 4a of FIG. 1 described in Embodiment 1. In FIG. 31, reference numeral 22a designates a first FET cell having a gate electrode pattern 14a formed between the drain electrode pattern 12a and the source electrode pattern 13a, and reference numeral 22b designates a second FET cell having a gate electrode pattern 14b formed between the drain electrode pattern 12c and the source electrode pattern 13b. An inductor line pattern 18 is formed between the above FET cells and also between the connection patterns 19a and 19b through an air bridge 15b. Thus, since the inductor line pattern 18 is disposed within the FET, the inductor line pattern can be made much shorter and the circuit can be made compact.

Embodiment 23

Figure 32:
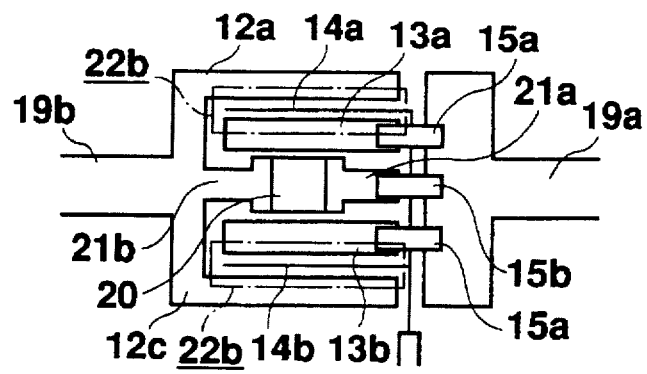
FIG. 32 is a structural diagram showing Embodiment 23 of the invention.

FIG. 32 is a circuit diagram showing Embodiment 23 of the invention, showing the first FET 1 connected to the first capacitor 2a of FIG. 1 described in Embodiment 1. In FIG. 32, reference numeral 20 designates an MIM capacitor which is formed between the first FET cell 22a and the second FET cell 22b. The MIM capacitor 20 is connected to the connection patterns 19 through the terminal line patterns 21 and the air bridge 15b. Thus, since the MIM capacitor 20 is disposed within the FET, the terminal line patterns 21 can be made much shorter.

Embodiment 24

Figure 33:
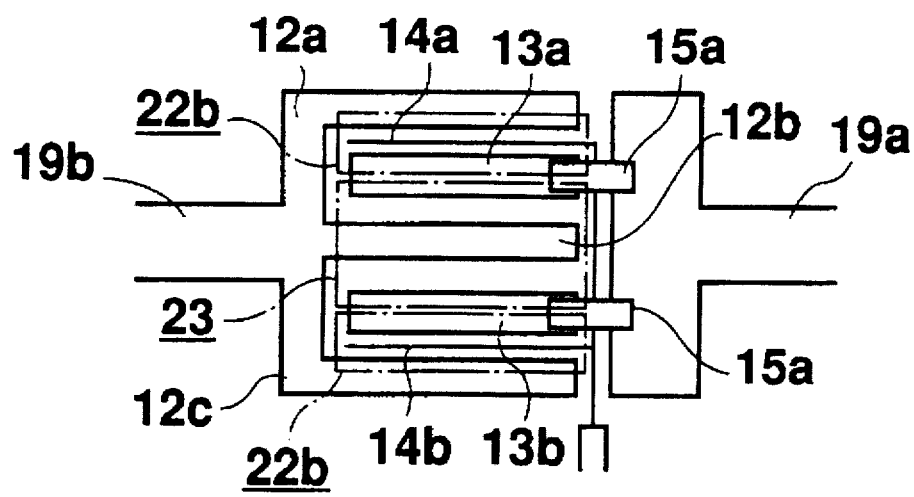
FIG. 33 is a structural diagram showing Embodiment 24 of the invention.

FIG. 33 is a circuit diagram showing Embodiment 24 of the invention, showing the first FET 1 connected to the first capacitor 2a of FIG. 1 described in Embodiment 1. In FIG. 33, reference numeral 23 designates an interdigital capacitor positioned between the first FET cell 22a and the second FET cell 22b and formed between the drain electrode pattern 12b and the source electrode patterns 13. Thus, the interdigital capacitor 23 is realized within the FET by virtue of the drain electrode pattern 12b and the source electrode patterns 13 of the FET, making it possible to constitute a compact capacitor without using an MIM capacitor.

Embodiment 25

Figure 34:
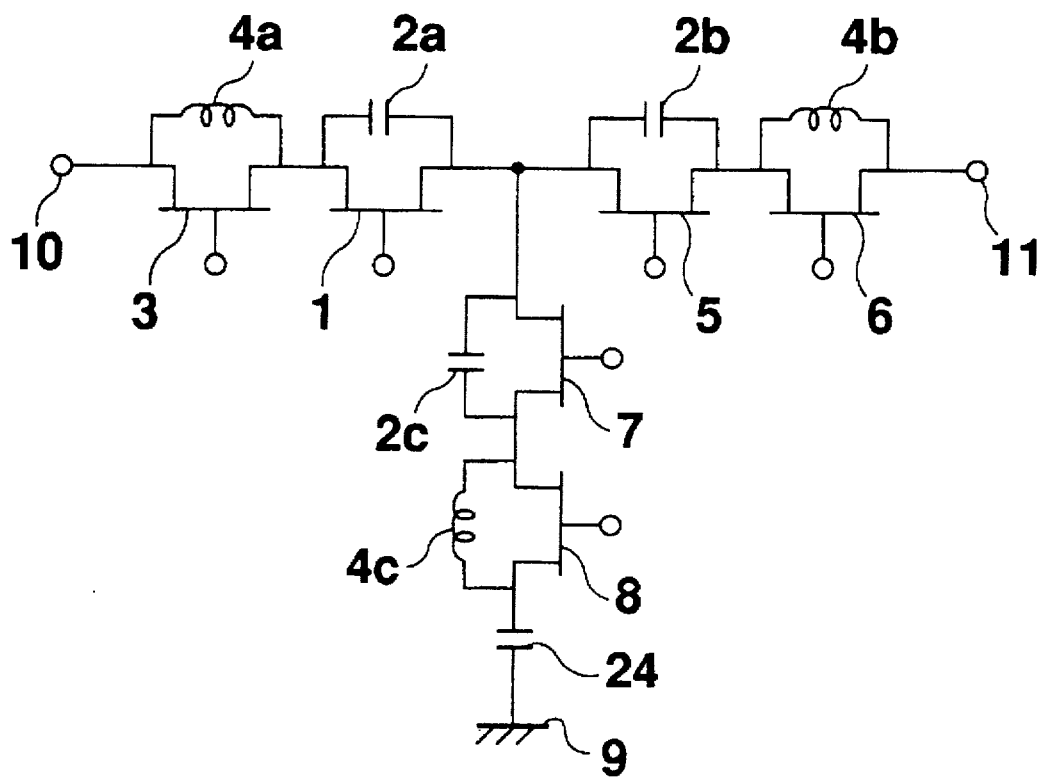
FIG. 34 is a circuit diagram showing Embodiment 34 of the invention.
Figure 35:
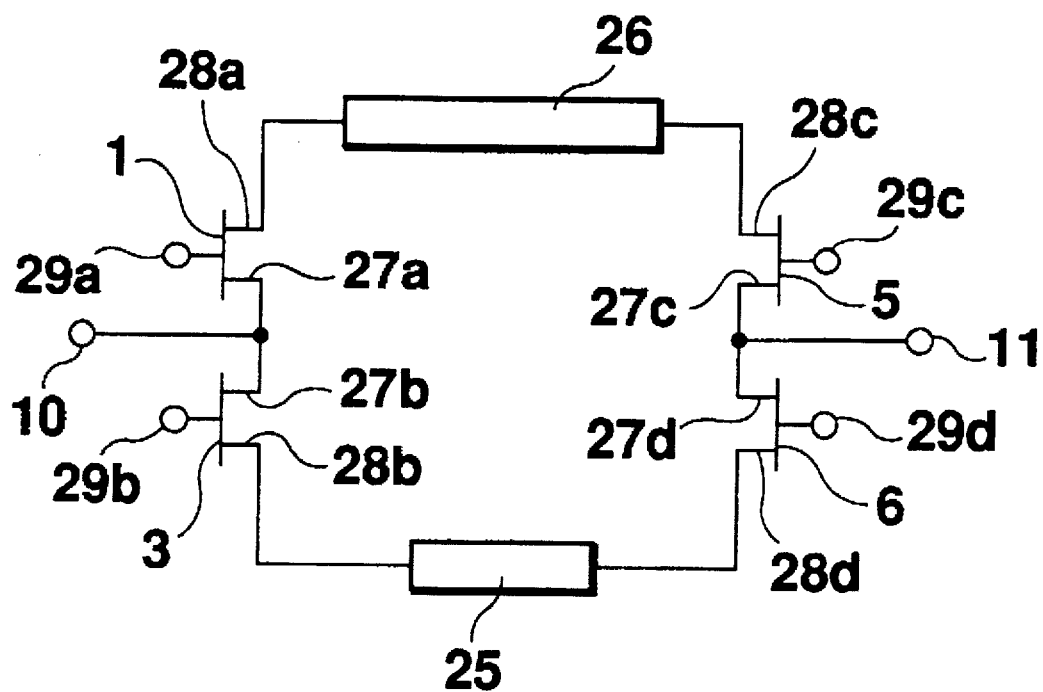
FIG. 35 is a circuit diagram showing a conventional phase shifter.

FIG. 34 is a circuit diagram showing Embodiment 25 of the invention. Reference numeral 24 designates a d.c. cutoff capacitor, and the drain electrode of the sixth FET 8 is grounded via the d.c. cutoff capacitor 24.

Description will be given of the operation. A voltage which determines whether the FET is on or off is generally determined according to a potential difference between the gate electrode and the drain and source electrodes, and when the drain electrode or the source electrode is grounded, the gate electrode is generally controlled by a negative voltage. In this embodiment, the drain and source electrodes of six FETs are not grounded by the d.c. cutoff capacitor 24. When a voltage ΔV (>|pinch-off voltage|) at a positive potential is applied to the source and drain electrodes of the first FET 1 through the sixth FET 8 from an unillustrated bias circuit, a high-frequency signal operates to effect cutoff and passage switching between the drain and source electrodes of the FETs by switching the gate voltage between 0V and ΔV. Specifically, since the gate voltage can be controlled at a positive potential, a TTL circuit whose output voltage is generally a positive voltage can be controlled directly, so that the circuit can be made compact including an external drive circuit.

In this embodiment, the phase shifter operates on the same principle as in Embodiment 1. When a constant of the d.c. cutoff capacitor 24 is determined so that impedance is sufficiently small with respect to a signal frequency used for the phase shifter, it operates to cut off direct current and also operates as a ground for a high-frequency signal. Thus, the phase shifting operation is not deteriorated. This embodiment has been described with reference to a T-type phase shifter, but the same operation and effect can be attained when applied to a π-type phase shifter or an LC phase shifter.

In the operations of the FETs used for the phase shifters in Embodiments 1 through 25, the drain electrode and the source electrode constituting the FET electrically operate equivalently. Therefore, the same effect can be attained even when the drain electrode and the source electrode are swapped over in Embodiment 1 through Embodiment 25. Though the line pattern is used as the inductor in Embodiment 1 through Embodiment 25, a spiral inductor or the like having a larger inductance or capacitance may be used depending on a desired inductance or capacitance.

Besides, Embodiment 1 through Embodiment 25 have covered phase shifters using the T-type phase-shifting circuit, π-type phase-shifting circuit and LC phase-shifting circuit which are in a single-stage configuration, but those with multiple stages may be used to provide the same operation and achieve the same effect.

The invention configured as described above provides the following effects.

Since configuration of the phase shifters of the invention switches between the T-type phase delay circuit and the T-type phase leading circuit depending on the lumped constant of the inductor and the capacitor, the phase shifter having a large phase-shifting quantity can be made compact, and the phase shifter having a small frequency characteristic can be designed by providing the phase delay circuit and the phase leading circuit with opposite frequency characteristics.

Since the invention switches between the T-type phase delay circuit and the T-type phase leading circuit depending on the lumped constant of the inductor and the capacitor, and the capacitor having a small capacitance required to attain a large phase-shifting quantity is realized by a capacitance with the FET off, the phase shifter obtained is compact and has only a small number of capacitor elements.

Since the invention switches between the T-type phase delay circuit and the T-type phase leading circuit depending on the lumped constant of the inductor and the capacitor, and the capacitor having a small capacitance required to attain a small phase-shifting quantity is realized by a capacitance with the FET off, the phase shifter obtained is compact and has only a small number of capacitor elements.

Since the invention switches between the T-type phase delay circuit and the T-type phase leading circuit depending on the lumped constant of the inductor and the capacitor and the capacitor having a small capacitance required to operate as the phase shifter in a high-frequency band is realized by a capacitance with the FET off, the phase shifter obtained is compact and has only a small number of capacitor elements.

Since the invention switches between the passing circuit and the T-type phase delay circuit depending on the lumped constant of the inductor and a capacitance with the FET off, the phase shifter obtained is compact with less loss and has only a small number of circuit elements which constitute the phase shifter.

Since the invention switches between the passing circuit and the T-type phase leading circuit by depending on the lumped constant of the inductor and the capacitor, the phase shifter obtained is compact with less loss and has only a small number of circuit elements which constitute the phase shifter.

Since the invention switches between the passing circuit and the T-type phase leading circuit depending on the lumped constant of the inductor and a capacitance with the FET off, the phase shifter obtained is compact with less loss and has only a small number of circuit elements which constitute the phase shifter.

Since the invention switches between the π-type phase delay circuit and the π-type phase leading circuit depending on the lumped constant of the inductor and the capacitor, the phase shifter having a large phase-shifting quantity can be made compact, and the phase shifter having a small frequency characteristic can be designed by providing the phase delay circuit and the phase leading circuit with opposite frequency characteristics.

Since the invention switches between the π-type phase delay circuit and the π-type phase leading circuit depending on the lumped constant of the inductor and the capacitor and the capacitor having a small capacitance required to attain a small phase-shifting quantity is realized by a capacitance with the FET off, the phase shifter obtained is compact and has only a small number of capacitor elements.

Since Embodiment 10 of the invention switches between the T-type phase delay circuit and the T-type phase leading circuit depending on the lumped constant of the inductor and the capacitor and the capacitor having a small capacitance required to attain a large phase-shifting quantity is realized by a capacitance with the FET off, the phase shifter obtained is compact and has only a small number of capacitor elements.

Since the invention switches between the π-type phase delay circuit and the π-type phase leading circuit depending on the lumped constant of the inductor and the capacitor, and the capacitor having a small capacitance required to operate as the phase shifter in a high-frequency band is realized by a capacitance with the FET off, the phase shifter obtained is compact and has only a small number of capacitor elements.

Since the invention switches between the passing circuit and the π-type phase leading circuit depending on the lumped constant of a capacitance with the inductor, capacitor and FET off, the phase shifter obtained is compact with less loss and has only a small number of circuit elements which constitute the phase shifter.

Since the invention switches between the passing circuit and the π-type phase leading circuit depending on the lumped constant of a capacitance with the inductor, capacitor and FET off, the phase shifter obtained is compact with less loss and has only a small number of circuit elements which constitute the phase shifter.

Since the invention switches between the passing circuit and the T-type phase delay circuit depending on the lumped constant of the inductor and a capacitance with the FET off, the phase shifter obtained is compact with less loss and has only a small number of circuit elements which constitute the phase shifter.

Since the invention switches between the LC phase leading circuit and the LC phase delay circuit depending on the lumped constant of a capacitance with the inductor, capacitor and FET off, the phase shifter obtained is compact with much less loss.

Since the invention switches between the LC phase leading circuit and the LC phase delay circuit depending on the lumped constant of a capacitance with the inductor and FET off, the phase shifter obtained is compact with much less loss without requiring a capacitor element.

Since the invention switches between the passing circuit and the LC phase delay circuit depending on the lumped constant of a capacitance with the inductor and FET off, the phase shifter obtained is compact with less loss and has only a small number of circuit elements which constitute the phase shifter.

Since the invention switches between the passing circuit and the LC phase leading circuit depending on the lumped constant of the inductor and the capacitor, the phase shifter obtained is compact with less loss and has only a small number of circuit elements which constitute the phase shifter.

Since the invention switches between the passing circuit and the LC phase leading circuit depending on the lumped constant of a capacitance with the inductor and FET off, the phase shifter obtained is compact with less loss and has only a small number of circuit elements which constitute the phase shifter.

Since the invention mounts the short inductor line pattern in parallel with an FET, the circuit can be made compact, the limitation of a small inductance is eased, and the phase shifter which stably operates in a high-frequency band can be designed easily.

Since the invention disposes the short line pattern which forms the I/O terminals of the capacitor mounted in parallel with FET, the circuit can be made compact, the parasitic inductance due to the line pattern is decreased, and the phase shifter with a reduced frequency characteristic can be designed.

Since the invention forms the inductor line pattern within the FET so as to be able to mount the inductor line pattern that is in parallel with the FET in a shorter form, the circuit can be made compact, the limitation of a small inductance is eased, and the phase shifter which stably operates in a high-frequency band can be designed easily.

Since the invention forms the MIM capacitor within the FET so as to be able to dispose the line pattern which forms the I/O terminals of the capacitor mounted in parallel with the FET in a shorter manner, the circuit can be made compact, the parasitic inductance due to the line pattern is decreased, and the phase shifter with a reduced frequency characteristic can be designed.

Since the invention forms the interdigital capacitor within the FET, the circuit can be made compact and the capacitor can be formed easily without using a circuit element such as an MIM capacitor.

Since the invention can control the gate voltage to a given voltage, the limitation against the drive circuit of the FET can be eased, and the phase shifter including the external drive circuit can be made compact.

While there have been described what are at present considered to be preferred embodiments of the invention, it will be understood that various modifications may be made thereto, and it is intended that the appended claims cover all such modifications as fall within the true spirit and scope of the invention.

What is claimed is:

1. A phase shifter for shifting a phase of a signal entered through an input terminal and outputting the phase-shifted signal from an output terminal, the phase shifter comprising:

a first serial circuit with one end connected to the input terminal, said first serial circuit including a first FET, a second FET, and a first inductor connected across a drain electrode and a source electrode of said second FET;

a second serial circuit connected between an other end of said first serial circuit and the output terminal, said second serial circuit including a third FET, a fourth FET, and a second inductor connected across a drain electrode and a source electrode of said fourth FET, and a third serial circuit connected between a ground and a node between the first and second serial circuits, said third serial circuit including a third circuit FET connected to said ground and a third circuit inductor connected across drain and source electrodes of said third circuit FET.

2. The phase shifter according to claim 1, wherein said first serial circuit comprises:

a first capacitor connected across a drain electrode and a source electrode, of said first FET, and said second FET connected in series between the input terminal and said first FET;

said second serial circuit comprises:

a second capacitor connected across a drain electrode and a source electrode of said third FET, and said fourth FET connected in series between the output terminal and said third FET;

said third serial circuit comprises:

a fifth FET having a third capacitor connected across a drain electrode and a source electrode of said fifth FET, with said fifth FET connected between said third circuit FET and said node between said first and second serial circuits.

3. The phase shifter according to claim 1, wherein:

said second FET is connected in series between the input terminal and said first FET; wherein said fourth FET is connected in series between an output terminal and said third FET; and said third serial circuit comprises:

a fifth FET having a third capacitor connected across a drain electrode and a source electrode of said fifth FET, with said fifth FET connected between said third circuit FET and said node between said first and second serial circuits.

4. The phase shifter according to claim 1, wherein said first serial circuit comprises:

a first capacitor connected across a drain electrode and a source electrode of said first FET, and said second FET connected in series between the input terminal and said first FET;

said second serial circuit comprises:

a second capacitor connected across a drain electrode and a source electrode of said third FET, and wherein said fourth FET is connected in series between the output terminal and said third FET; and said third serial circuit comprises:

a fifth FET, said fifth FET connected between said third circuit FET and said node between said first and second serial circuits.

5. The phase shifter according to claim 1, wherein:

said second FET is connected in series between an input terminal and said first FET; and wherein said fourth FET is connected in series between the output terminal and said third FET; and said third serial circuit comprises:

a fifth FET, said fifth FET connected between said third circuit FET and said node between said first and second serial circuits.

6. The phase shifter according to claim 1, wherein the source electrode and the drain electrode of said third circuit FET have an interdigital (comb teeth) shape which is formed by arranging at least one strip-shaped pattern in parallel, and said third circuit inductor having an inductor line pattern, formed by said third circuit inductor connecting at least one digit of said interdigital source electrode pattern to at least one digit of said interdigital drain electrode pattern.

7. The phase shifter according to claim 2, wherein the source electrode and the drain electrode of at least one of said FETs with said connected inductor have an interdigital (comb teeth) shape which is formed by arranging at least one strip-shaped pattern in parallel, and said inductor connected across said at least one FET with said interdigital shape having an inductor line pattern, said inductor line pattern formed by said connected inductor connecting at least one digit of said interdigital source electrode pattern to at least one digit of said interdigital drain electrode pattern.

8. The phase shifter according to claim 3, wherein the source electrode and the drain electrode of at least one of said FETs with said connected inductor have an interdigital (comb teeth) shape which is formed by arranging at least one strip-shaped pattern in parallel, and said inductor connected across said at least one FET with said interdigital shape having an inductor line pattern, said inductor line pattern formed by said connected inductor connecting at least one digit of said interdigital source electrode pattern to at least one digit of said interdigital drain electrode pattern.

9. The phase shifter according to claim 4, wherein the source electrode and the drain electrode of at least one of said FETs with said connected inductor have an interdigital (comb teeth) shape which is formed by arranging at least one strip-shaped pattern in parallel, and said inductor connected across said at least one FET with said interdigital shape having an inductor line pattern, said inductor line pattern formed by said connected inductor connecting at least one digit of said interdigital source electrode pattern to at least one digit of said interdigital drain electrode pattern.

10. The phase shifter according to claim 5, wherein the source electrode and the drain electrode of at least one of said FETs with said connected inductor have an interdigital (comb teeth) shape which is formed by arranging at least one strip-shaped pattern in parallel, and said inductor connected across said at least one FET with said interdigital shape having an inductor line pattern, said inductor line pattern formed by said connected inductor connecting at least one digit of said interdigital source electrode pattern to at least one digit of said interdigital drain electrode pattern.

11. The phase shifter according to claim 2, wherein the source electrode and the drain electrode of at least one of said FETs with said connected capacitor have an interdigital (comb teeth) shape which is formed by arranging at least one strip-shaped pattern in parallel, and said capacitor connected across said at least one FET having the interdigital shaped electrodes is formed by connecting at least one digit of said interdigital source electrode pattern to at least one digit of said interdigital drain electrode pattern.

12. The phase shifter according to claim 3, wherein the source electrode and the drain electrode of at least one of said FETs with said connected capacitor have an interdigital (comb teeth) shape which is formed by arranging at least one strip-shaped pattern in parallel, and said capacitor connected across said at least one FET having the interdigital shaped electrodes is formed by connecting at least one digit of said interdigital source electrode pattern to at least one digit of said interdigital drain electrode pattern.

13. The phase shifter according to claim 4, wherein the source electrode and the drain electrode of at least one of said FETs with said connected capacitor have an interdigital (comb teeth) shape which is formed by arranging at least one strip-shaped pattern in parallel, and said capacitor connected across said at least one FET having the interdigital shaped electrodes is formed by connecting at least one digit of said interdigital source electrode pattern to at least one digit of said interdigital drain electrode pattern.

14. The phase shifter according to claim 1, wherein the source electrode and the drain electrode of said third circuit FET have an interdigital (comb teeth) shape which is formed by arranging at least one strip-shaped pattern in parallel, and wherein a gate electrode pattern is disposed in a gap part between at least one digit of said interdigital source and said interdigital drain electrode patterns and remaining digits of said interdigital source and said interdigital drain electrode patterns are connected to form said inductor.

15. The phase shifter according to claim 2, wherein the source electrode and the drain electrode of at least one FET among said FETs have an interdigital (comb teeth) shape which is formed by arranging at least one strip-shaped pattern in parallel, and wherein a gate electrode pattern is disposed in a gap part between at least one digit of said interdigital source and said interdigital drain electrode patterns and remaining digits of said interdigital source and said interdigital drain electrode patterns are connected to form said inductor.

16. The phase shifter according to claim 3, wherein the source electrode and the drain electrode of at least one FET among said FETs have an interdigital (comb teeth) shape which is formed by arranging at least one strip-shaped pattern in parallel, and wherein a gate electrode pattern is disposed in a gap part between at least one digit of said interdigital source and said interdigital drain electrode patterns and remaining digits of said interdigital source and said interdigital drain electrode patterns are connected to form said inductor.

17. The phase shifter according to claim 4, wherein the source electrode and the drain electrode of at least one FET among said FETs have an interdigital (comb teeth) shape which is formed by arranging at least one strip-shaped pattern in parallel, and wherein a gate electrode pattern is disposed in a gap part between at least one digit of said interdigital source and said interdigital drain electrode patterns and remaining digits of said interdigital source and said interdigital drain electrode patterns are connected to form said inductor.

18. The phase shifter according to claim 5, wherein the source electrode and the drain electrode of at least one FET among said FETs have an interdigital (comb teeth) shape which is formed by arranging at least one strip-shaped pattern in parallel, and wherein a gate electrode pattern is disposed in a gap part between at least one digit of said interdigital source and said interdigital drain electrode patterns and remaining digits of said interdigital source and said interdigital drain electrode patterns are connected to form said inductor.

19. The phase shifter according to claim 2, wherein the source electrode and the drain electrode of at least one FET among said FETs have an interdigital (comb teeth) shape which is formed by arranging at least one strip-shaped pattern in parallel, and wherein a gate electrode pattern is disposed in a gap part between at least one digit of said interdigital source and said interdigital drain electrode patterns and a metal insulator metal capacitor is formed on part of the remaining digits of said interdigital source and said interdigital drain electrode patterns to form said capacitors.

20. The phase shifter according to claim 3, wherein the source electrode and the drain electrode of at least one FET among said FETs have an interdigital (comb teeth) shape which is formed by arranging at least one strip-shaped pattern in parallel, and wherein a gate electrode pattern is disposed in a gap part between at least one digit of said interdigital source and said interdigital drain electrode patterns and a metal insulator metal capacitor is formed on part of the remaining digits of said interdigital source and said interdigital drain electrode patterns to form said capacitors.

21. The phase shifter according to claim 4, wherein the source electrode and the drain electrode of at least one FET among said FETs have an interdigital (comb teeth) shape which is formed by arranging at least one strip-shaped pattern in parallel, and wherein a gate electrode pattern is disposed in a gap part between at least one digit of said interdigital source and said interdigital drain electrode patterns and a metal insulator metal capacitor is formed on part of the remaining digits of said interdigital source and said interdigital drain electrode patterns to form said capacitors.

22. The phase shifter according to claim 2, wherein the source electrode and the drain electrode of at least one FET among said FETs have an interdigital (comb teeth) shape which is formed by arranging at least one strip-shaped pattern in parallel, and wherein a gate electrode pattern is disposed in a gap part between at least one digit of said interdigital source and said interdigital drain electrode patterns and an interdigital capacitor is formed in a gap between remaining digits of said interdigital source and said interdigital drain electrode patterns to form said capacitors.

23. The phase shifter according to claim 3, wherein the source electrode and the drain electrode of at least one FET among said FETs have an interdigital (comb teeth) shape which is formed by arranging at least one strip-shaped pattern in parallel, and wherein a gate electrode pattern is disposed in a gap part between at least one digit of said interdigital source and said interdigital drain electrode patterns and an interdigital capacitor is formed in a gap between remaining digits of said interdigital source and said interdigital drain electrode patterns to form said capacitors.

24. The phase shifter according to claim 4, wherein the source electrode and the drain electrode of at least one FET among said FETs have an interdigital (comb teeth) shape which is formed by arranging at least one strip-shaped pattern in parallel, and wherein a gate electrode pattern is disposed in a gap part between at least one digit of said interdigital source and said interdigital drain electrode patterns and an interdigital capacitor is formed in a gap between remaining digits of said interdigital source and said interdigital drain electrode patterns to form said capacitors.

25. The phase shifter according to claim 1, wherein the source electrode or drain electrode of said third circuit FET which is connected in parallel with a line connecting said input and said output is grounded via a capacitor.

26. The phase shifter according to claim 2, wherein the source electrode or drain electrode of said third circuit FET which is connected in parallel with a line connecting said input and said output is grounded via a capacitor.

27. The phase shifter according to claim 3, wherein the source electrode or drain electrode of said third circuit FET which is connected in parallel with a line connecting said input and said output is grounded via a capacitor.

28. The phase shifter according to claim 4, wherein the source electrode or drain electrode of said third circuit FET which is connected in parallel with a line connecting said input and said output is grounded via a capacitor.

29. The phase shifter according to claim 5, wherein the source electrode or drain electrode of said third circuit FET which is connected in parallel with a line connecting said input and said output is grounded via a capacitor.

* * * * *